United States Patent
Lee et al.

(10) Patent No.: US 10,325,842 B2
(45) Date of Patent: Jun. 18, 2019

(54) SUBSTRATE FOR PACKAGING A SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Chih-Cheng Lee, Kaohsiung (TW); Yuan-Chang Su, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/699,816

(22) Filed: Sep. 8, 2017

(65) Prior Publication Data
US 2019/0080995 A1 Mar. 14, 2019

(51) Int. Cl.
*H05K 1/02* (2006.01)
*H01L 23/498* (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC ... H05K 1/02; H05K 1/03; H05K 1/11; H05K 1/16; H05K 1/18; H05K 3/00; H05K 3/40; H05K 3/46; H01L 21/02; H01L 21/32; H01L 21/44; H01L 21/48; H01L 23/48; H01L 23/488; H01L 23/522; H01L 31/05; H01L 31/18; H01L 31/52; H01L 31/232; H01L 31/522
(Continued)

(56) References Cited

U.S. PATENT DOCUMENTS 8,237,270 B2 * 8/2012 Kobayashi .......... H01L 21/4853
174/258
9,018,538 B2 * 4/2015 Kodani ............... H01L 21/4853
174/255
(Continued)

FOREIGN PATENT DOCUMENTS

TW 1472283 B 2/2015

*Primary Examiner* — Xiaoliang Chen
(74) *Attorney, Agent, or Firm* — Foley & Lardner LLP; Cliff Z. Liu

(57) ABSTRACT

A substrate for packaging a semiconductor device includes a first dielectric layer having a first surface and a second surface opposite to the first surface, a first patterned conductive layer adjacent to the first surface of the first dielectric layer, and a second patterned conductive layer adjacent to the second surface of the first dielectric layer and electrically connected to the first patterned conductive layer. The first patterned conductive layer includes a first portion and a second portion. Each of the first portion and the second portion is embedded in the first dielectric layer and protrudes relative to the first surface of the first dielectric layer toward a direction away from the second surface of the first dielectric layer. A thickness of the first portion of the first patterned conductive layer is greater than a thickness of the second portion of the first patterned conductive layer.

20 Claims, 37 Drawing Sheets

(51) Int. Cl.
*H01L 21/48* (2006.01)
*H01L 21/683* (2006.01)

(52) U.S. Cl.
CPC .... *H01L 21/6835* (2013.01); *H01L 23/49822* (2013.01); *H01L 23/49827* (2013.01)

(58) Field of Classification Search
USPC ....... 174/261, 250, 254, 255, 258, 260, 262, 174/264; 361/783; 438/70, 126, 597; 136/246
See application file for complete search history.

(56) References Cited

U.S. PATENT DOCUMENTS

| | | | | |
|---|---|---|---|---|
| 9,168,384 | B2* | 10/2015 | Askarinya | A61N 1/375 |
| 9,781,840 | B2* | 10/2017 | Nagaya | H05K 3/341 |
| 9,812,450 | B2* | 11/2017 | Baek | H01L 27/0886 |
| 2004/0253769 | A1* | 12/2004 | Mita | H01L 21/486 |
| | | | | 438/126 |
| 2005/0155792 | A1* | 7/2005 | Ito | H05K 3/4069 |
| | | | | 174/264 |
| 2006/0261826 | A1* | 11/2006 | Ito | G01R 1/0735 |
| | | | | 324/755.01 |
| 2008/0296765 | A1* | 12/2008 | Kurita | H01L 23/481 |
| | | | | 257/738 |
| 2009/0242242 | A1* | 10/2009 | Ishii | H05K 3/326 |
| | | | | 174/254 |
| 2012/0211271 | A1* | 8/2012 | Hando | H01L 21/6835 |
| | | | | 174/261 |
| 2013/0051010 | A1* | 2/2013 | Nakamura | F21V 5/007 |
| | | | | 362/235 |
| 2013/0100626 | A1* | 4/2013 | Inoue | H05K 1/118 |
| | | | | 361/783 |
| 2013/0220400 | A1* | 8/2013 | Kim | H01L 31/022425 |
| | | | | 136/246 |
| 2013/0264671 | A1* | 10/2013 | Yun | H01L 27/14621 |
| | | | | 257/432 |
| 2014/0077357 | A1* | 3/2014 | Kung | H01L 23/48 |
| | | | | 257/737 |
| 2016/0135302 | A1* | 5/2016 | Nagaya | H05K 1/0206 |
| | | | | 174/255 |
| 2016/0276266 | A1* | 9/2016 | Liu | H01L 21/76807 |
| 2016/0307842 | A1* | 10/2016 | Baek | H01L 27/0886 |
| 2017/0148666 | A1* | 5/2017 | Liu | H01L 21/76816 |
| 2017/0196096 | A1* | 7/2017 | Ishihara | H05K 3/4682 |
| 2018/0130759 | A1* | 5/2018 | Ho | H01L 24/08 |
| 2018/0138113 | A1* | 5/2018 | Chen | H01L 23/49827 |

* cited by examiner

SUBSTRATE FOR PACKAGING A SEMICONDUCTOR DEVICE PACKAGE AND A METHOD OF MANUFACTURING THE SAME

BACKGROUND

1. Technical Field

The present disclosure relates to a substrate for packaging a semiconductor device, and to substrate for which a thickness of a first portion of a first patterned conductive layer of the substrate is greater than a thickness of a second portion of the first patterned conductive layer of the substrate.

2. Description of the Related Art

In some semiconductor device packages, a substrate is used to package the semiconductor device. The substrate may include a first conductive layer adjacent to one side of the substrate, and a second conductive layer adjacent to the other side of the substrate. Each of the first conductive layer and the second conductive layer are covered or surrounded by a dielectric layer (e.g. a solder mask layer) for protection. Warpage issues may occur in the substrate which may adversely affect the subsequent operations (e.g. a bent substrate (caused by warpage) may result in reliability issue when or subsequent to attaching the semiconductor device to the substrate). Structural differences between the dielectric layers, the first conductive layer, the second conductive layer, and the dielectric layers (e.g. asymmetric structure/arrangement, quantity, dimensions) may lead to warpage of the substrate.

SUMMARY

In some embodiments, according to one aspect, a substrate for packaging a semiconductor device includes a first dielectric layer having a first surface and a second surface opposite to the first surface, a first patterned conductive layer adjacent to the first surface of the first dielectric layer, and a second patterned conductive layer adjacent to the second surface of the first dielectric layer and electrically connected to the first patterned conductive layer. The first patterned conductive layer includes a first portion and a second portion. Each of the first portion and the second portion are embedded in the first dielectric layer and protrude relative to the first surface of the first dielectric layer toward a direction away from the second surface of the first dielectric layer. A thickness of the first portion of the first patterned conductive layer is greater than a thickness of the second portion of the first patterned conductive layer.

In some embodiments, according to another aspect, a substrate for packaging a semiconductor device includes a first dielectric layer having a first surface and a second surface opposite to the first surface, a first patterned conductive layer adjacent to the first surface of the first dielectric layer, and a second patterned conductive layer adjacent to the second surface of the first dielectric layer and electrically connected to the first patterned conductive layer. The second patterned conductive layer includes a first portion and a second portion, and the first portion of the second patterned conductive layer has a curved surface adjacent to the second surface of the first dielectric layer.

In some embodiments, according to another aspect, a method is disclosed for manufacturing a substrate. The method includes: providing a carrier with a first surface and a conductive layer disposed on the first surface of the carrier; forming a patterned photoresist layer on the conductive layer; etching the conductive layer to form a plurality of first cavities; forming a first patterned conductive layer in the first plurality of cavities; removing the patterned photoresist layer; laminating a dielectric layer on the first patterned conductive layer; forming a second patterned conductive layer on a second surface of the dielectric layer; and removing the carrier and etching the conductive layer to expose the first patterned conductive layer.

DETAILED DESCRIPTION

Figure 1:
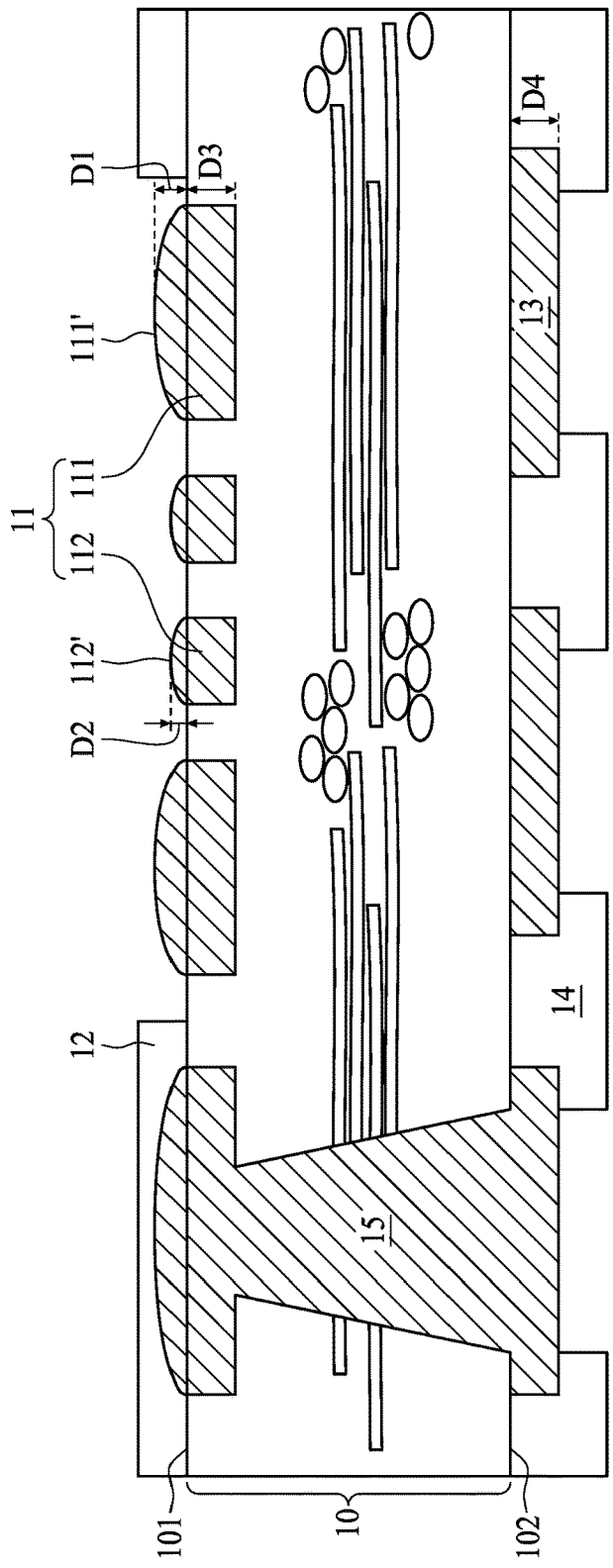
FIG. 1 illustrates a cross-sectional view of a substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the components as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of a substrate 1 for packaging a semiconductor device in accordance with some embodiments of the present disclosure. The substrate 1 includes a dielectric layer 10, a patterned conductive layer 11, a dielectric layer 12, a patterned conductive layer 13, a dielectric layer 14, and an interconnection element 15.

The dielectric layer 10 has a surface 101 and a surface 102 opposite to the surface 101. The dielectric layer 10 includes a resin layer and a fiberglass.

The patterned conductive layer 11 is adjacent to the surface 101 of the dielectric layer 10. The patterned conductive layer 11 is an integrated layer (e.g., integrally formed or monolithic layer). The patterned conductive layer 11 includes a portion 111 and a portion 112. In some embodiments, the portion 111 of the patterned conductive layer 11 is a conductive pad. The portion 112 of the patterned conductive layer 11 is a trace. Each of the portion 111 and the portion 112 of the patterned conductive layer 11 is embedded in the dielectric layer 10. Each of the portion 111 and the portion 112 of the patterned conductive layer 11 protrude relative to the surface 101 of the dielectric layer 10 toward a direction away from the surface 102 of the dielectric layer 10.

In some embodiments, two portions 112 may be surrounded by two portions 111. The two portions 112 may be disposed between the two portions 111. The pitch between two adjacent portions 112 (e.g. the distance between a central line of one portion 112 to another central line of another portion 112) may be in a range from approximately 6 micrometers (μm) to approximately 8 μm. In one or more embodiments, the pitch between two adjacent portions 112 is less than or equal to about 7 μm. A dimension (e.g. a thickness in the vertical direction, according to the orientation shown in FIG. 1) of the portion 112 of the patterned conductive layer 11 may be in a range from approximately 6 μm to approximately 8 μm. In one or more embodiments, a dimension of one of the portions 112 of the first patterned conductive layer is less than or equal to about 7 μm. In one or more embodiments, one of the portions 112 of the first patterned conductive layer is adjacent to one of the portions 111 of the first patterned conductive layer, and a pitch between the one of the portions 112 of the first patterned conductive layer and the one of the portions 111 of the first patterned conductive layer is less than or equal to about 7 μm.

The portion 111 of the patterned conductive layer 11 protrudes a first distance D1 relative to the surface 101 of the dielectric layer 10. The portion 112 of the patterned conductive layer 11 protrudes a second distance D2 relative to the surface 101 of dielectric layer 10. The portions 111 and 112 of the patterned conductive layer 11 are embedded in the dielectric layer 10 (e.g. extend into the dielectric layer 10) by a third distance D3. The first distance D1 is greater than the second distance D2; for example, D1 is at least about 1.1 times, at least about 1.3 times, or at least about 1.3 times D2. A thickness of the portion 111 of the patterned conductive layer 11 is greater than a thickness of the portion 112 of the patterned conductive layer 11; for example, the thickness of the portion 111 is at least about 1.1 times, at least about 1.3 times, or at least about 1.3 times the thickness of the portion 112.

The portion 111 of the patterned conductive layer 11 has a top surface 111'. The portion 112 of the patterned conductive layer 11 has a top surface 112'. The top surface 111' of the portion 111 of the patterned conductive layer 11 has a curved shape. The top surface 112' of the portion 112 of the patterned conductive layer 11 has a curved shape.

The patterned conductive layer 13 is adjacent to the surface 102 of the dielectric layer 10. The patterned conductive layer 13 is on the surface 102 of the dielectric layer 10. The patterned conductive layer 13 has a thickness D4. The patterned conductive layer 11 is electrically connected to the patterned conductive layer 13 via the interconnection element 15. In some embodiments, the patterned conductive layer 11, the patterned conductive layer 13, and the interconnection element 15 may include copper, a copper alloy, another metal, or other suitable materials.

In some embodiments, the thickness of the patterned conductive layer 11 may be selected (e.g. an amount of protrusion of the protrusion portions relative to the surface 101 of the dielectric layer 10 may be selected) based on design specifications. The average metal amount per a given area distributed on the surface 101 of the dielectric layer 10 may be selected to balance with the average metal amount per a given area distributed on the surface 102 of the dielectric layer 10 such that the upwardly bending of the left end and the right end of the dielectric layer 10 (e.g. during a heating process) may be mitigated. By this arrangement of the patterned conductive layer 11, the warpage issue may be balanced without adjusting the thickness of the dielectric layer 12 or 14.

The dielectric layer 12 is disposed on the surface 101 of the dielectric layer 10. The dielectric layer 12 partially covers the patterned conductive layer 11. In some embodiments, the dielectric layer 12 may include a solder mask layer (e.g. including an epoxy) or other suitable materials.

The dielectric layer 14 is disposed on the surface 102 of the dielectric layer 10. The dielectric layer 14 partially covers the patterned conductive layer 13. In some embodiments, the dielectric layer 14 may include a solder mask layer (e.g. including an epoxy) or other suitable materials.

Figure 2:
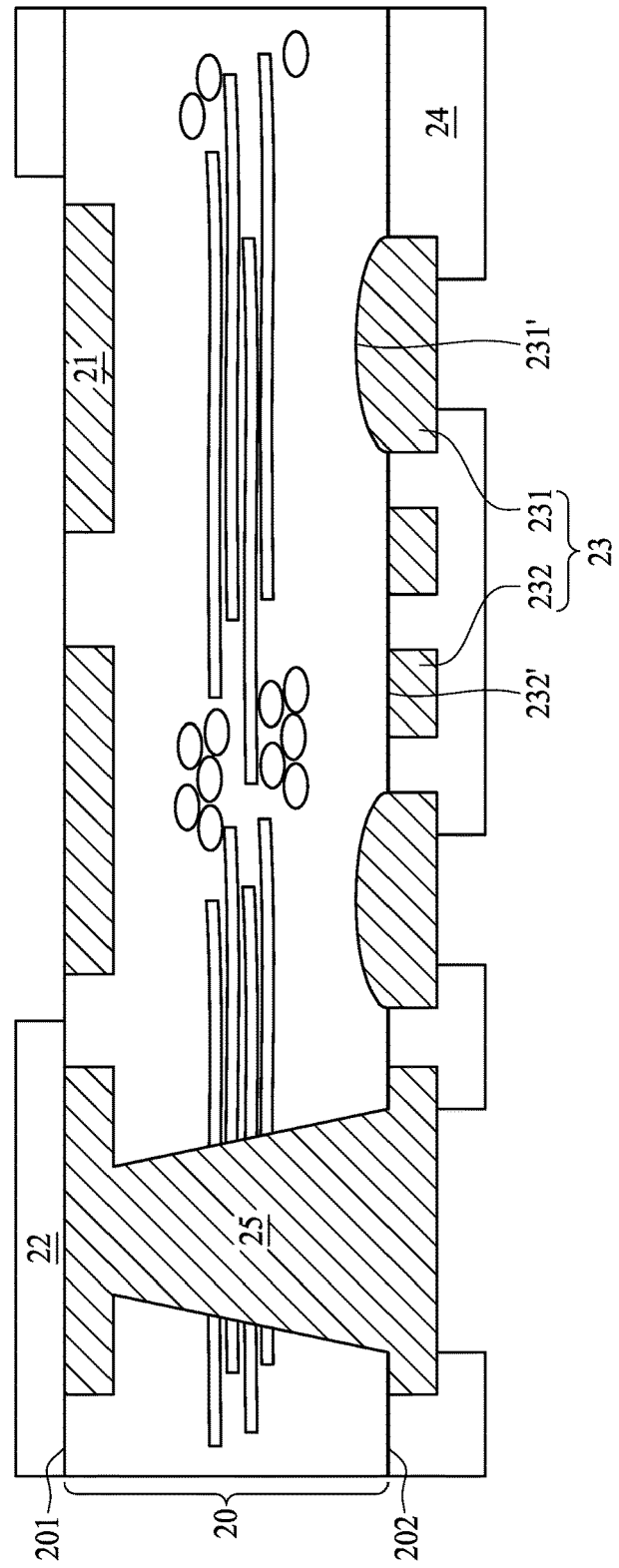
FIG. 2 illustrates a cross-sectional view of a substrate according to some embodiments of the present disclosure.

FIG. 2 is a cross-sectional view of a substrate 2 for packaging a semiconductor device in accordance with some embodiments of the present disclosure. The substrate 2 includes a dielectric layer 20, a patterned conductive layer 21, a dielectric layer 22, a patterned conductive layer 23, a dielectric layer 24, and an interconnection element 25.

The dielectric layer 20 has a surface 201 and a surface 202 opposite to the surface 201. The dielectric layer 20 includes a resin layer and a fiberglass.

The patterned conductive layer 23 is adjacent to the surface 202 of the dielectric layer 20. The patterned conductive layer 23 includes a portion 231 and a portion 232. In some embodiments, the portion 231 of the patterned conductive layer 23 is a conductive pad. The portion 232 of the patterned conductive layer 23 is a trace. The portion 231 of the patterned conductive layer 23 is embedded in the dielectric layer 20. The portion 231 of the patterned conductive layer 23 protrudes relative to the surface 202 of the dielectric layer 20 toward a direction away from the surface 201 of the dielectric layer 20.

In some embodiments, two portions 232 may be surrounded by two portions 231. The two portions 232 may be disposed between the two portions 231.

The portion 231 of the patterned conductive layer 23 has a top surface 231'. The portion 232 of the patterned conductive layer 23 has a top surface 232'. The top surface 231' of the portion 231 of the patterned conductive layer 23 has a curved shape. The curved top surface 231' of the portion 231 of the patterned conductive layer 23 is embedded in the surface 202 of the dielectric layer 20. The curved top surface 231' of the portion 231 of the patterned conductive layer 23 is adjacent to the surface 202 of the dielectric layer 20. The top surface 232' of the portion 232 of the patterned conductive layer 23 has a substantially planar shape.

The patterned conductive layer 21 is adjacent to the surface 201 of the dielectric layer 20. The patterned conductive layer 21 is embedded in the surface 201 of the dielectric layer 20. The patterned conductive layer 21 is electrically connected to the patterned conductive layer 23 via the interconnection element 25. In some embodiments, the patterned conductive layer 21, the patterned conductive layer 23, and the interconnection element 25 may include copper, a copper alloy, another metal, or other suitable materials. A thickness of the portion 231 of the patterned conductive layer 23 is greater than a thickness of the portion 232 of the patterned conductive layer 23; for example, the thickness of the portion 231 is at least about 1.1 times, at least about 1.3 times, or at least about 1.3 times the thickness of the portion 232.

The dielectric layer 22 is disposed on the surface 201 of the dielectric layer 20. The dielectric layer 22 partially covers the patterned conductive layer 21. In some embodiments, the dielectric layer 22 may include a solder mask layer (e.g. including an epoxy) or other suitable materials.

The dielectric layer 24 is disposed on the surface 202 of the dielectric layer 20. The dielectric layer 24 partially covers the patterned conductive layer 23. In some embodiments, the dielectric layer 24 may include a solder mask layer (e.g. including an epoxy) or other suitable materials. Since the portion 231 of the patterned conductive layer 23 is embedded in the surface 202 of the dielectric layer 20, the thickness of the dielectric layer 24 may be correspondingly thinned and still cover at least a portion of the portion 231 of the patterned conductive layer 23. Accordingly, the thickness of the dielectric layer 22 can also be correspondingly thinned.

Figure 3:
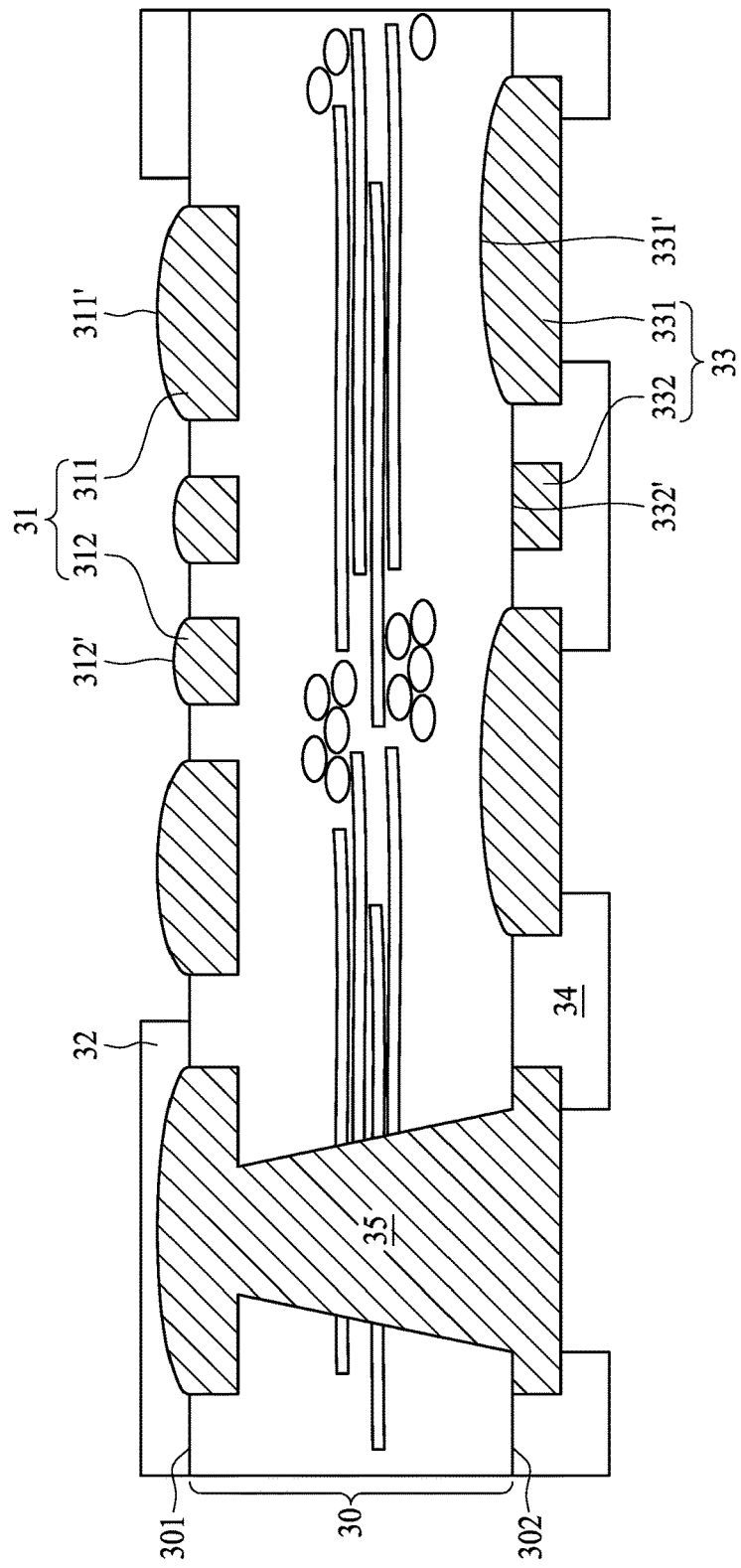
FIG. 3 illustrates a cross-sectional view of a substrate according to some embodiments of the present disclosure.

FIG. 3 is a cross-sectional view of a substrate 3 for packaging a semiconductor device in accordance with some embodiments of the present disclosure. The substrate 3 includes a dielectric layer 30, a patterned conductive layer 31, a dielectric layer 32, a patterned conductive layer 33, a dielectric layer 34, and an interconnection element 35. The structure shown in FIG. 3 is a modified structure of the structures shown in FIG. 1 and FIG. 2, and the structure of FIG. 3 may provide for benefits of the structures shown in both FIG. 1 and FIG. 2.

The dielectric layer 30 has a surface 301 and a surface 302 opposite to the surface 301. The dielectric layer 30 includes a resin layer and a fiberglass.

The patterned conductive layer 31 is adjacent to the surface 301 of the dielectric layer 30. The patterned conductive layer 31 includes a portion 311 and a portion 312. In some embodiments, the portion 311 of the patterned conductive layer 31 is a conductive pad. The portion 312 of the patterned conductive layer 31 is a trace. Each of the portion 311 and the portion 312 of the patterned conductive layer 31 is embedded in the dielectric layer 30. Each of the portion 311 and the portion 312 of the patterned conductive layer 31 protrudes relative to the surface 301 of the dielectric layer 30 toward a direction away from the surface 302 of the dielectric layer 30.

A thickness of the portion 311 of the patterned conductive layer 31 is greater than a thickness of the portion 312 of the patterned conductive layer 31. The portion 311 of the patterned conductive layer 31 has a top surface 311'. The portion 312 of the patterned conductive layer 31 has a top surface 312'. The top surface 311' of the portion 311 of the patterned conductive layer 31 has a curved shape. The top surface 312' of the portion 312 of the patterned conductive layer 31 has a curved shape.

The patterned conductive layer 33 is adjacent to the surface 302 of the dielectric layer 30. The patterned conductive layer 33 includes a portion 331 and a portion 332. In some embodiments, the portion 331 of the patterned conductive layer 33 is a conductive pad. The portion 332 of the patterned conductive layer 33 is a trace. The portion 331 of the patterned conductive layer 33 is embedded in the dielectric layer 30. The portion 331 of the patterned conductive layer 33 protrudes relative to the surface 302 of the dielectric layer 30 toward a direction away from the surface 301 of the dielectric layer 30.

The portion 331 of the patterned conductive layer 33 has a top surface 331'. The portion 332 of the patterned conductive layer 33 has a top surface 332'. The top surface 331' of the portion 331 of the patterned conductive layer 33 has a curved shape. The curved top surface 331' of the portion 331 of the patterned conductive layer 33 is embedded in the surface 302 of the dielectric layer 30. The curved top surface 331' of the portion 331 of the patterned conductive layer 33 is adjacent to the surface 302 of the dielectric layer 30. The top surface 332' of the portion 332 of the patterned conductive layer 33 has a substantially planar shape.

The dielectric layer 32 is disposed on the surface 301 of the dielectric layer 30. The dielectric layer 32 partially covers the patterned conductive layer 31. In some embodiments, the dielectric layer 32 may include a solder mask layer (e.g. including an epoxy) or other suitable materials.

The dielectric layer 34 is disposed on the surface 302 of the dielectric layer 30. The dielectric layer 34 partially covers the patterned conductive layer 33. In some embodiments, the dielectric layer 34 may include a solder mask layer (e.g. including an epoxy) or other suitable materials.

In some embodiments, by implementing the structure shown in FIG. 3, warpage issues can be balanced as discussed above in reference to FIG. 1, and the thickness of the substrate 3 can be thinned as discussed above in reference to FIG. 2.

FIG. 4A through FIG. 4L illustrate some embodiments of a method of manufacturing the substrate 1 according to some embodiments of the present disclosure.

Figure 4A:
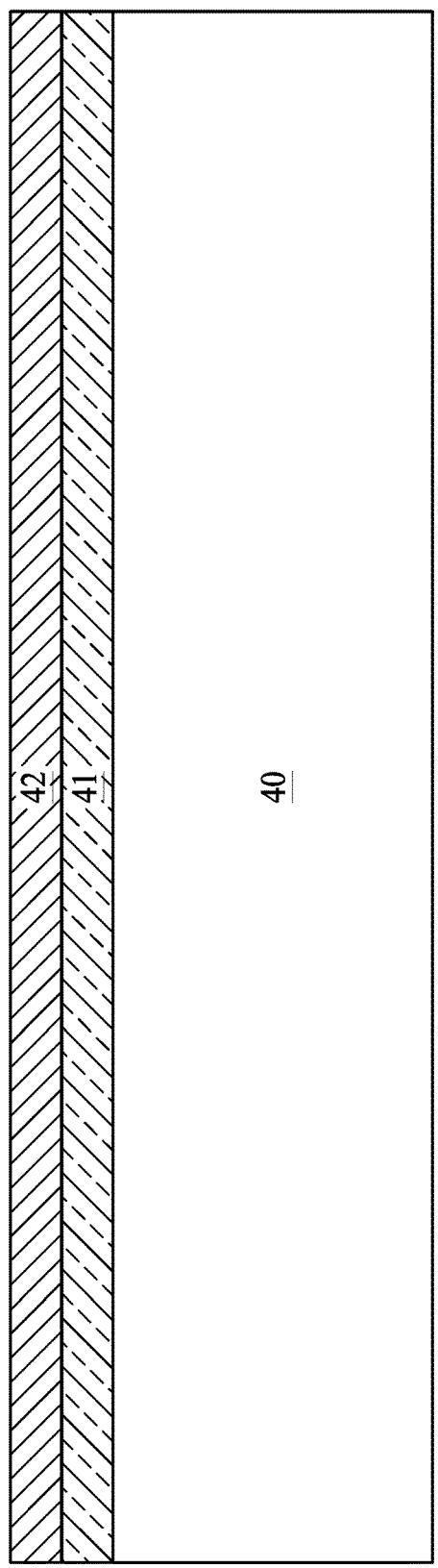
FIG. 4A illustrates a method of manufacturing a substrate according to some embodiments of the present disclosure.

Referring to FIG. 4A, a method for manufacturing the substrate 1 includes providing a carrier 40 with a conductive layer 41 and a conductive layer 42. The thickness of the conductive layer 41 is in a range from approximately 15 μm to approximately 20 μm. The thickness of the conductive layer 42 is in a range from approximately 5 μm to approximately 10 μm. In some embodiments, the conductive layer 41 includes copper, a copper alloy, or another metal. The conductive layer 42 includes nickel, a nickel alloy, or another metal.

Figure 4B:
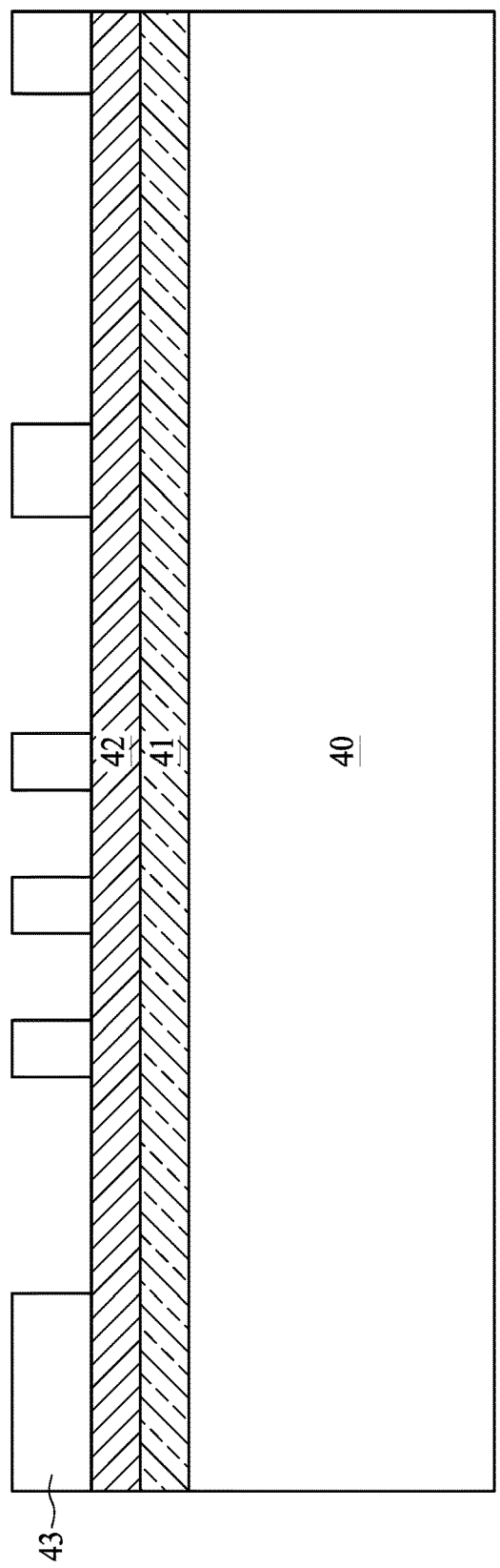
FIG. 4B illustrates a method of manufacturing a substrate according to some embodiments of the present disclosure.

Referring to FIG. 4B, a patterned photoresist layer 43 is applied on the conductive layer 32. A ratio of a height of an aperture of the patterned photoresist layer 43 to a width of the aperture of the patterned photoresist layer 43 is less than about 2.5 or equal to about 2.5. If the ratio is higher than 2.5, the patterned photoresist layer 43 may collapse during the subsequent operations.

Figure 4C:
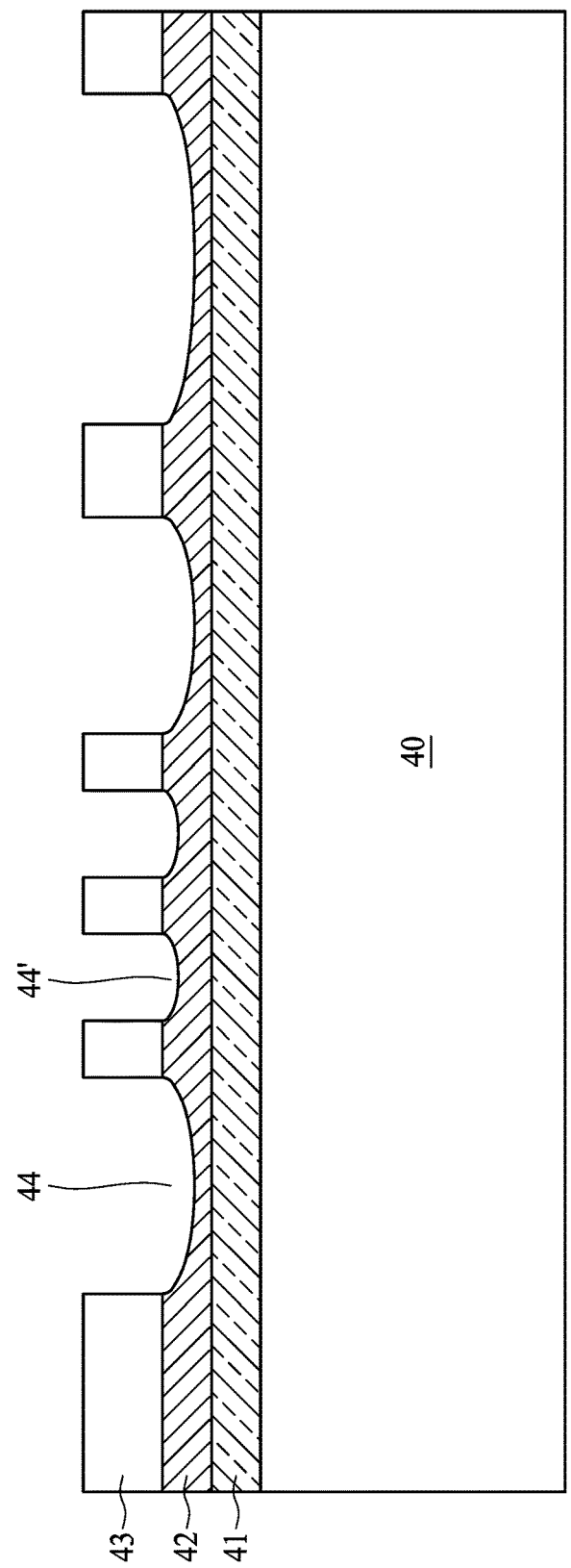
FIG. 4C illustrates a method of manufacturing a substrate according to some embodiments of the present disclosure.

Referring to FIG. 4C, the conductive layer 42 is etched to form a recess (or cavity) 44 and a recess (or cavity) 44'. The depth of the recess 44 is greater than the depth of the recess 44'. The depth of the recess 44 is less than a thickness of the conductive layer 42.

Figure 4D:
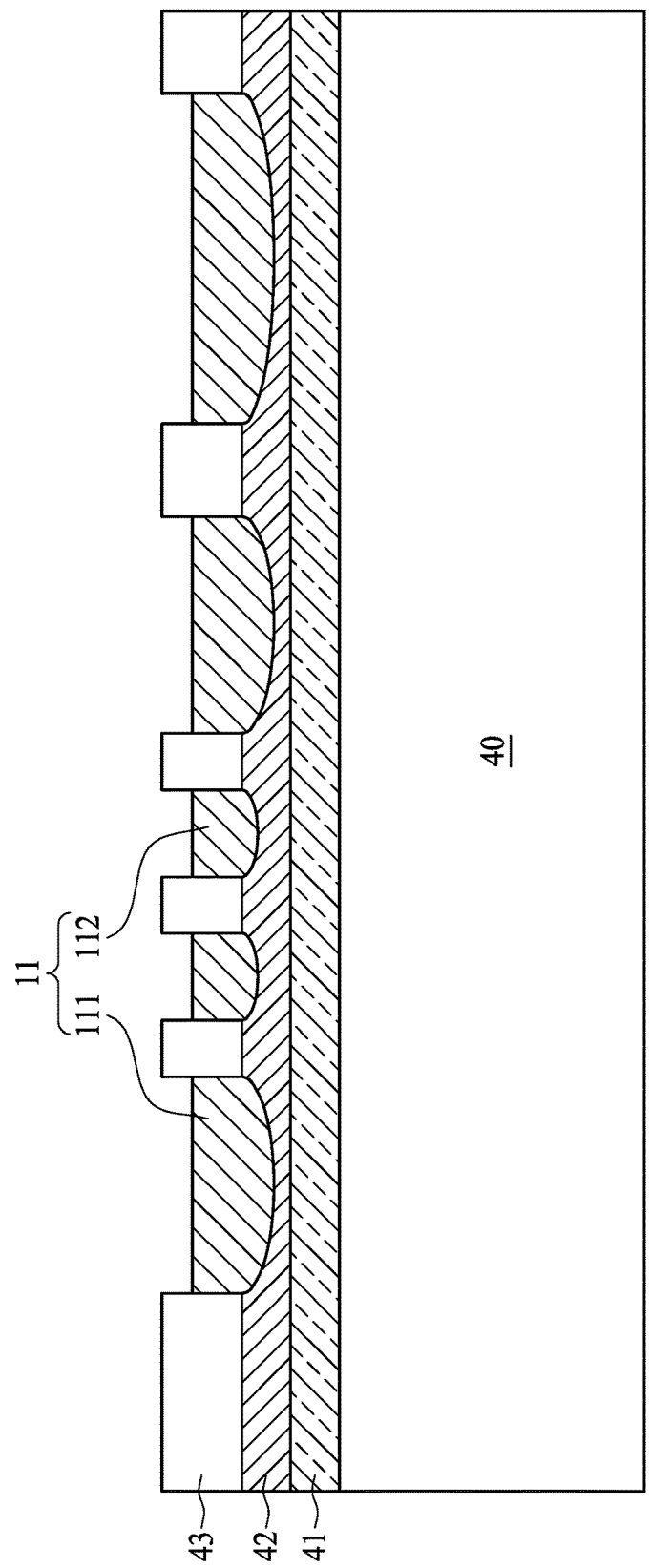
FIG. 4D illustrates a method of manufacturing a substrate according to some embodiments of the present disclosure.

Referring to FIG. 4D, the patterned conductive layer 11 is formed over or in the recess 44 and the recess 44'. The patterned conductive layer 11 includes the portion 111 and the portion 112. The portion 111 of the patterned conductive layer 11 is formed in the recess 44. The portion 112 of the patterned conductive layer 11 is formed in the recess 44'.

Figure 4E:
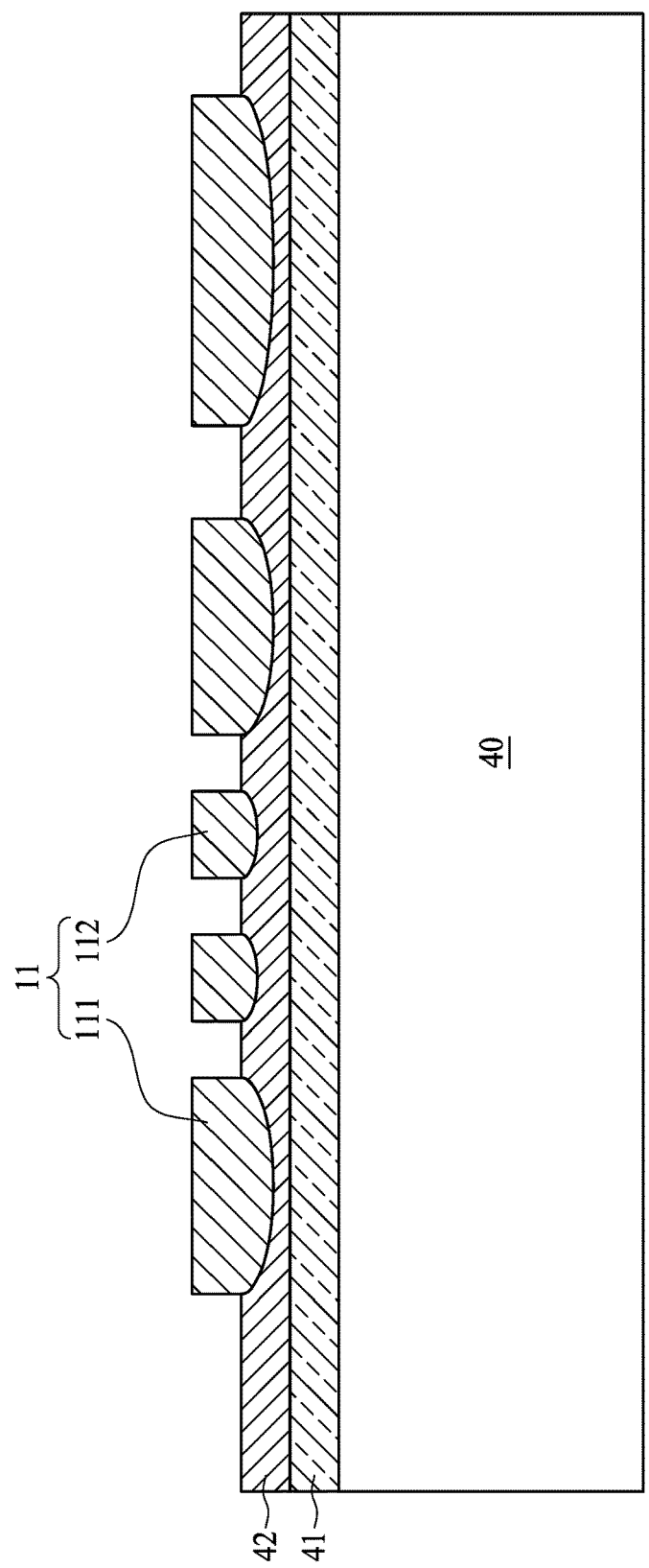
FIG. 4E illustrates a method of manufacturing a substrate according to some embodiments of the present disclosure.

Referring to FIG. 4E, the patterned photoresist layer 43 is stripped to expose the portion 111 and the portion 112 of the patterned conductive layer 11.

Figure 4F:
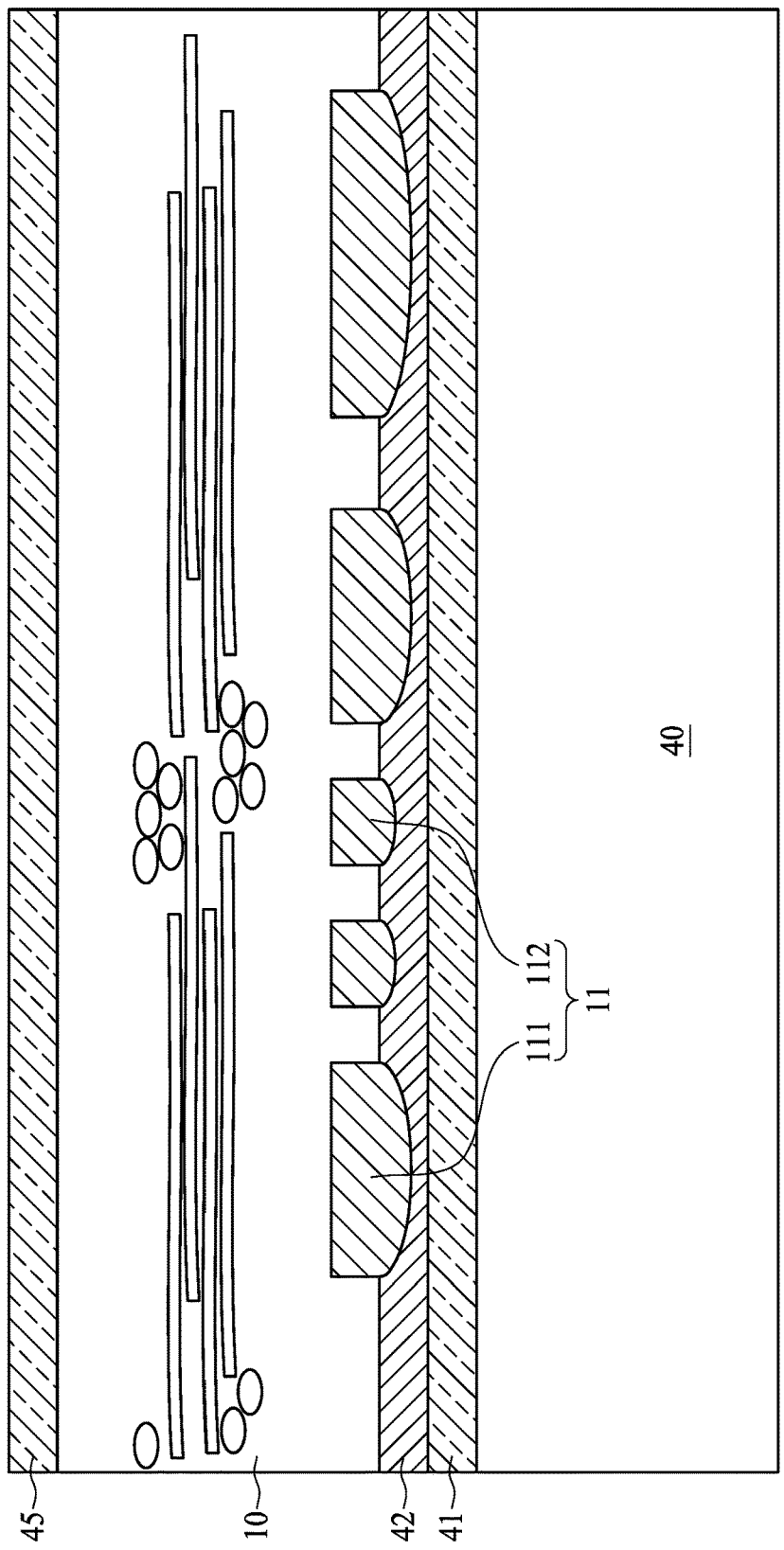
FIG. 4F illustrates a method of manufacturing a substrate according to some embodiments of the present disclosure.

Referring to FIG. 4F, the dielectric layer 10 is laminated on the patterned conductive layer 11. The dielectric layer 10 includes a resin layer and a fiberglass. A conductive layer 45 is disposed on the dielectric layer 10.

Figure 4G:
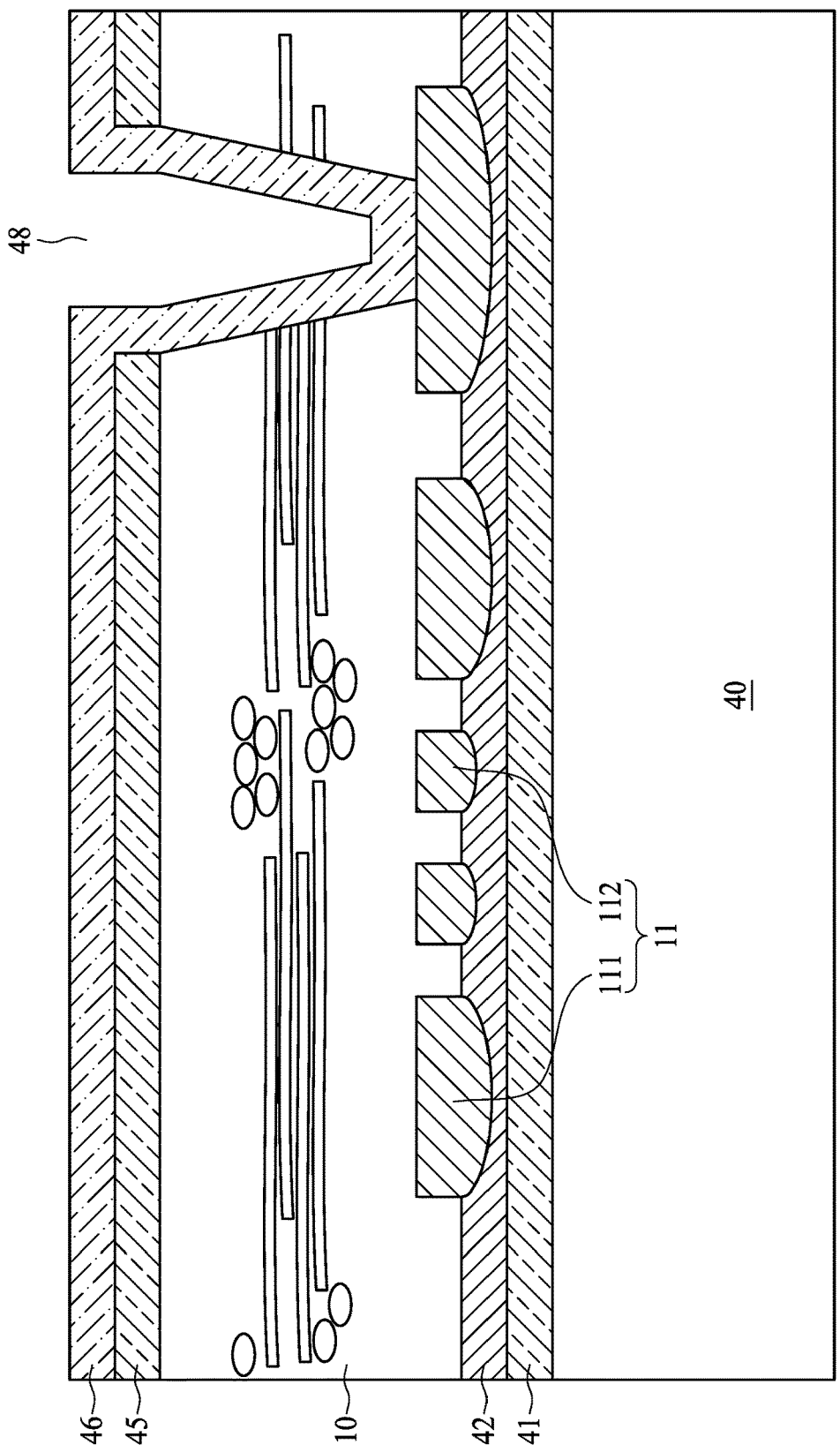
FIG. 4G illustrates a method of manufacturing a substrate according to some embodiments of the present disclosure.

Referring to FIG. 4G, an opening 48 is formed in the dielectric layer 10 to expose the patterned conductive layer 11. The opening 48 of the dielectric layer 10 may be formed by a laser drilling technique, a mechanical drilling technique, or an etching technique. A seed layer 46 is formed over the conductive layer 45 and the dielectric layer 10, and in the opening 48.

Figure 4H:
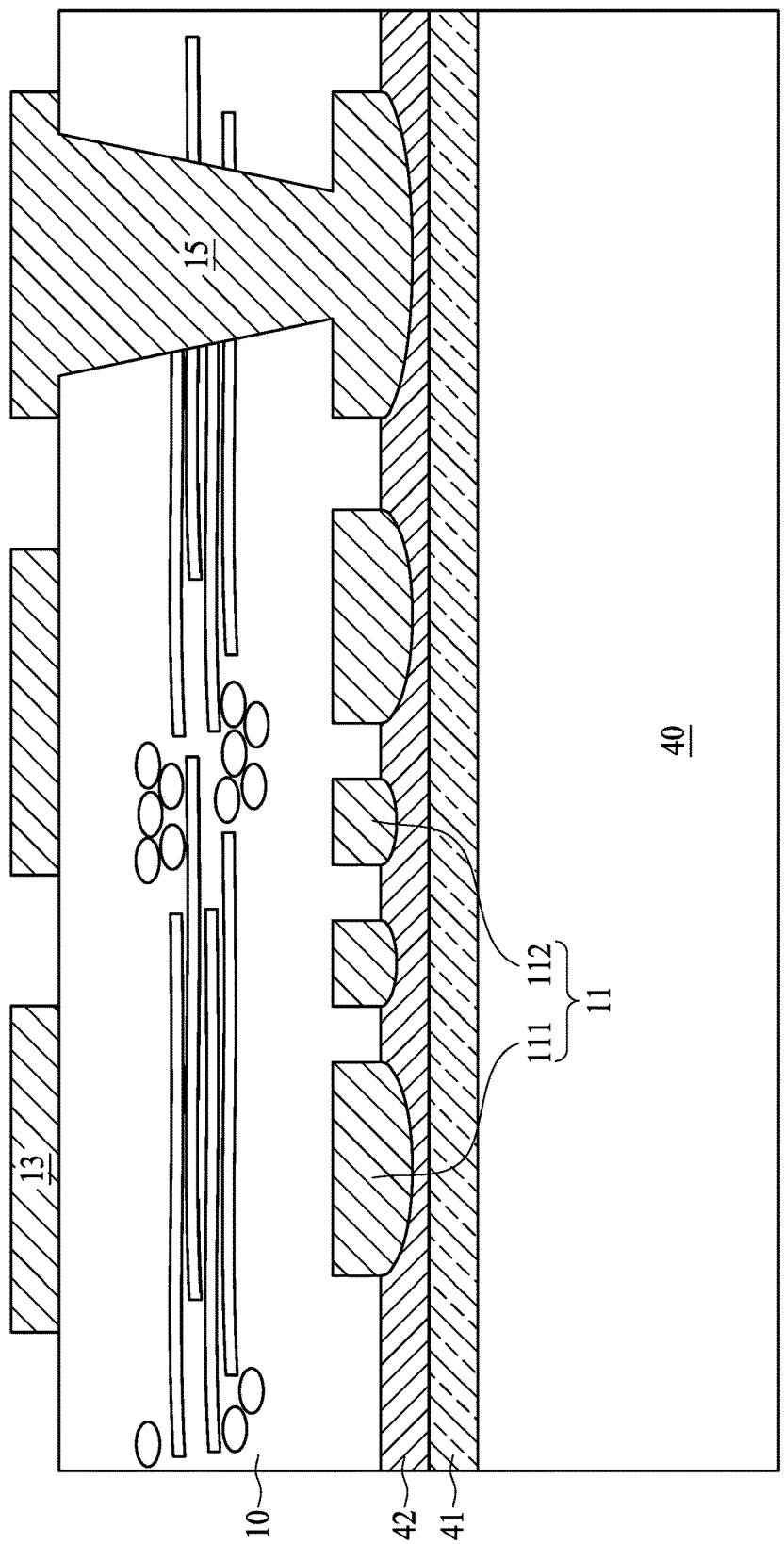
FIG. 4H illustrates a method of manufacturing a substrate according to some embodiments of the present disclosure.

Referring to FIG. 4H, the patterned conductive layer 13 is formed on the dielectric layer 10. The interconnection element 15 is formed to electrically connect the patterned conductive layer 11 to the patterned conductive layer 13.

Figure 4I:
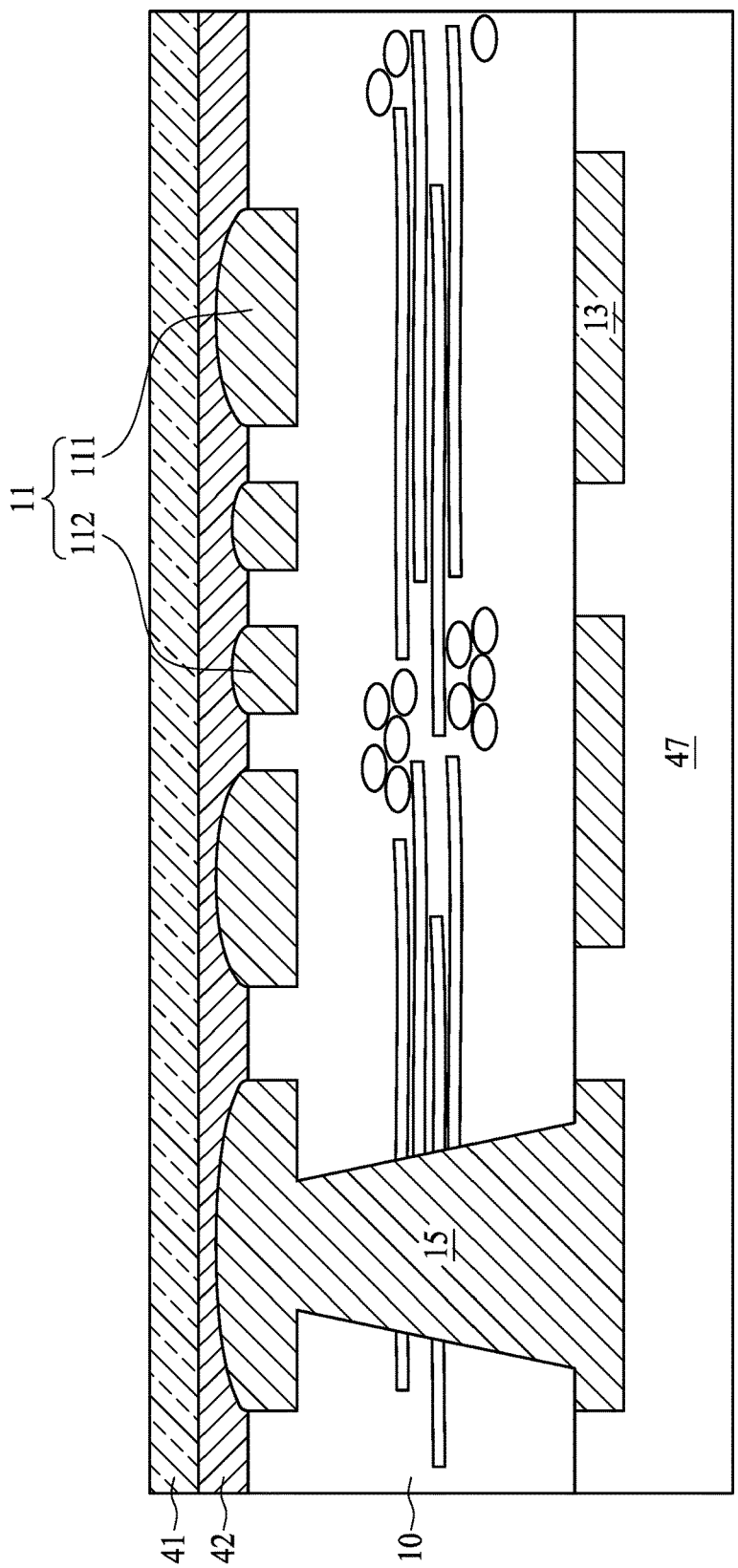
FIG. 4I illustrates a method of manufacturing a substrate according to some embodiments of the present disclosure.

Referring to FIG. 4I, a dielectric layer 47 is laminated on the dielectric layer 10 to cover (e.g. completely cover) the patterned conductive layer 13. The dielectric layer 47 may be a photoresist dry film. The carrier 40 is removed.

Figure 4J:
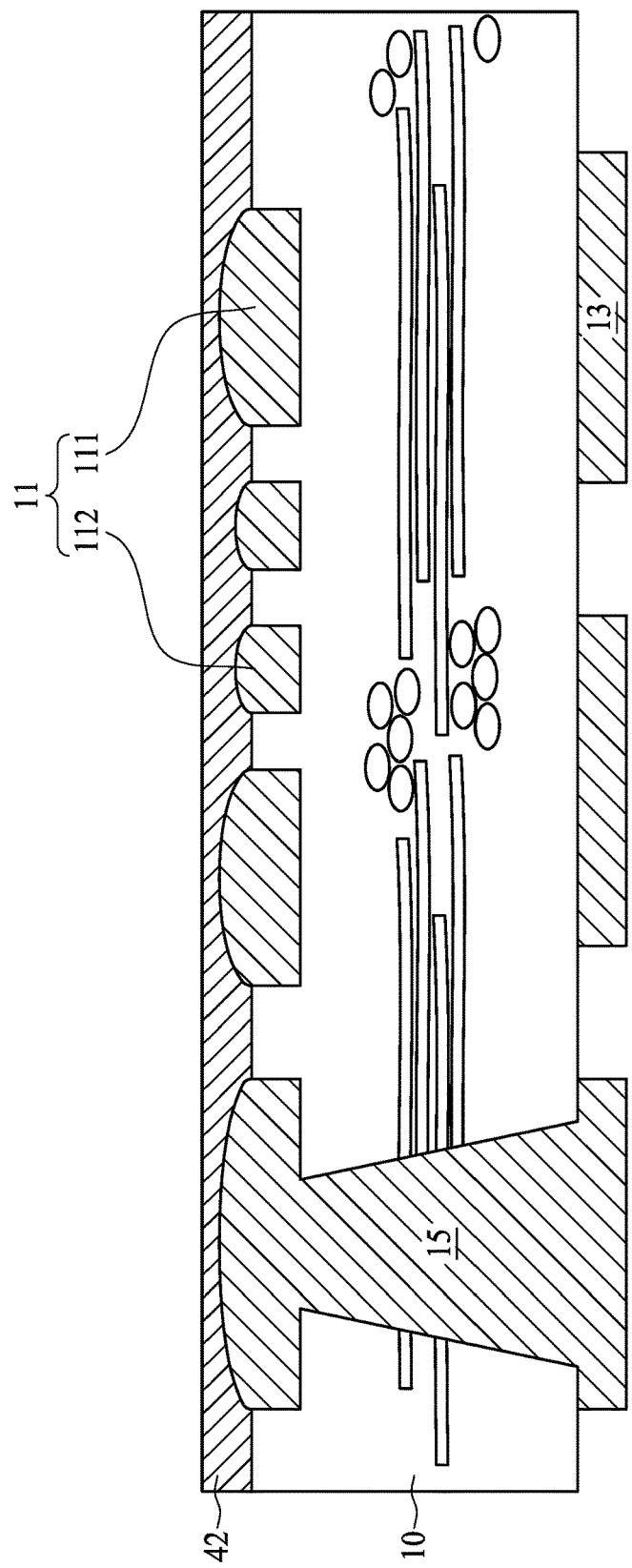
FIG. 4J illustrates a method of manufacturing a substrate according to some embodiments of the present disclosure.

Referring to FIG. 4J, the conductive layer 41 is etched to expose the conductive layer 42. Then, the dielectric layer 47 is stripped to expose the patterned conductive layer 13.

Figure 4K:
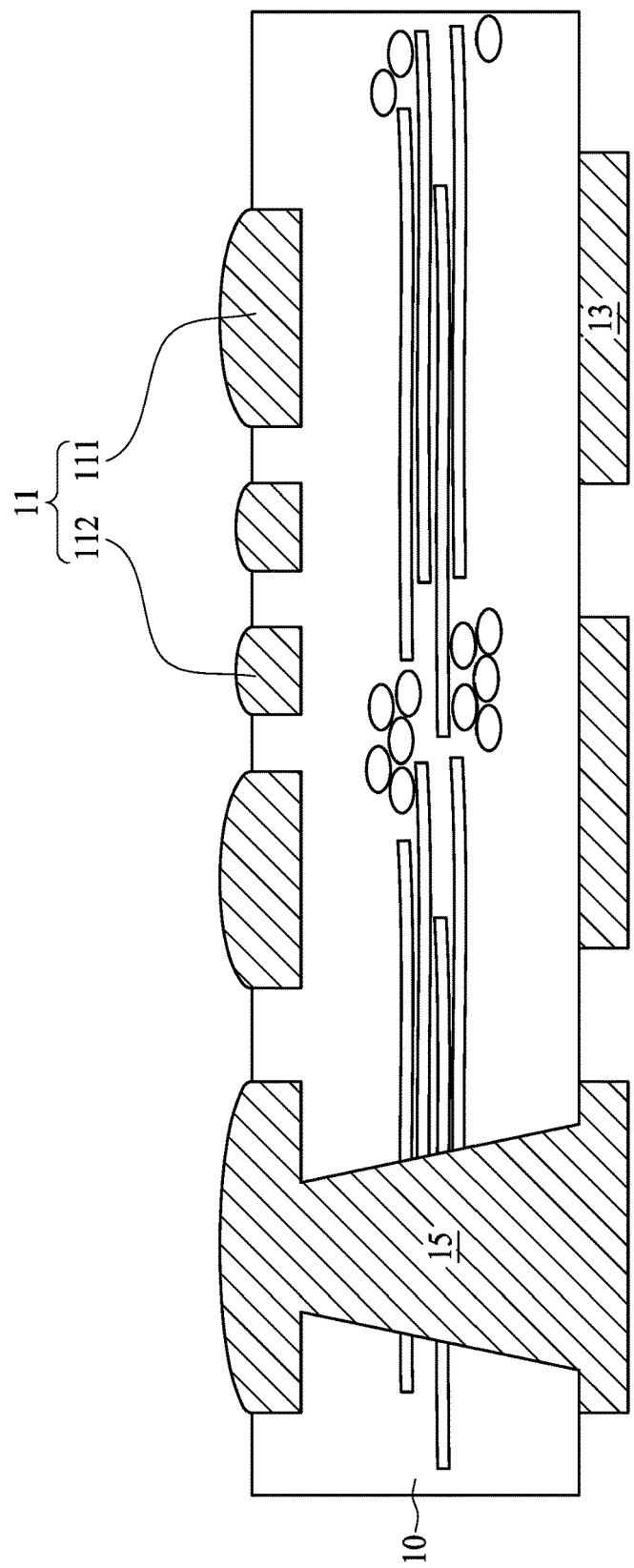
FIG. 4K illustrates a method of manufacturing a substrate according to some embodiments of the present disclosure.

Referring to FIG. 4K, the conductive layer 42 is etched to expose the patterned conductive layer 11. Since the conductive material of the conductive layer 42 is different from the conductive material of the patterned conductive layer 11, there is a high etch selectivity ratio between the conductive layer 42 and the patterned conductive layer 11.

Figure 4L:
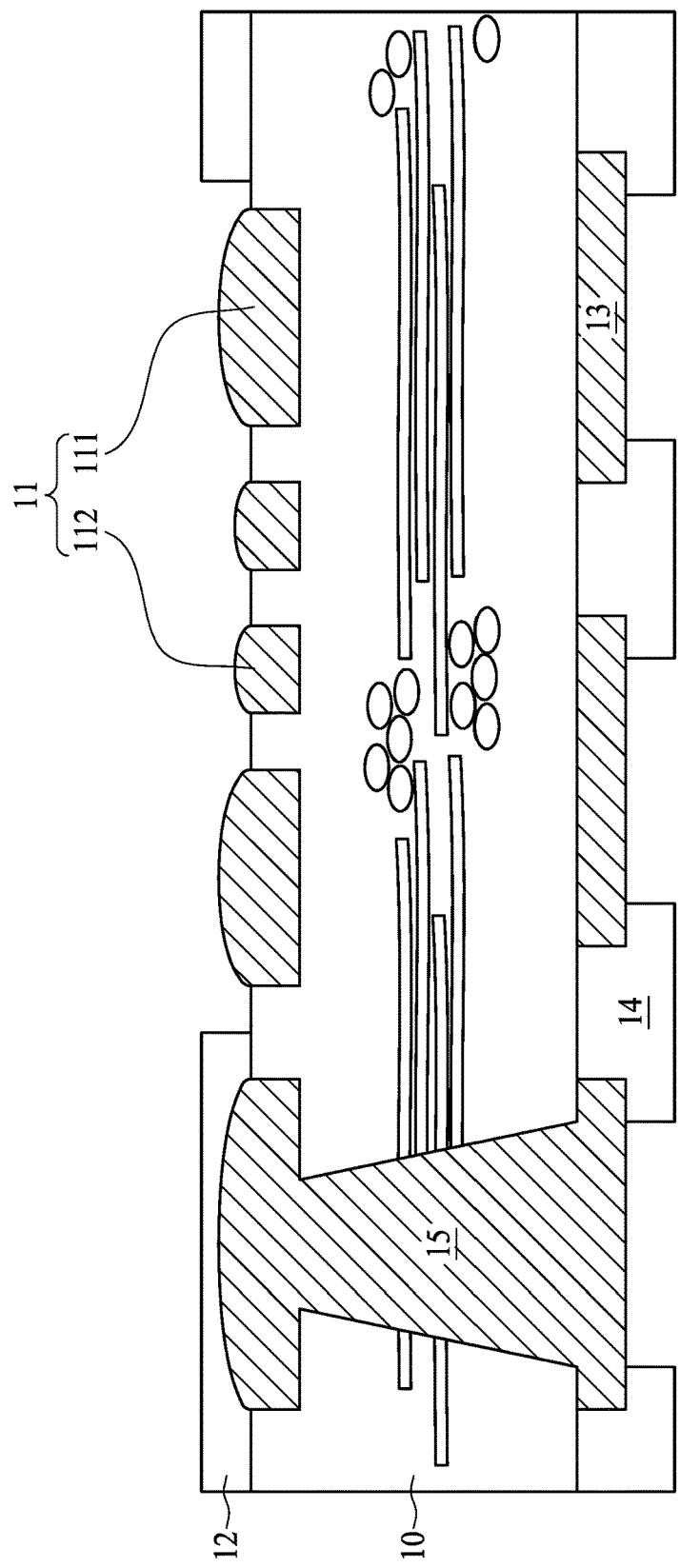
FIG. 4L illustrates a method of manufacturing a substrate according to some embodiments of the present disclosure.

Referring to FIG. 4L, the dielectric layer 12 is formed on the dielectric layer 10 to partially cover the patterned conductive layer 11 (e.g. to cover a portion of the patterned conductive layer 11 that is in contact with the interconnection element 15). The dielectric layer 14 is formed on the dielectric layer 10 to partially cover the patterned conductive layer 13. The dielectric layers 12 and 14 may be a solder mask layer.

Figure 5A:
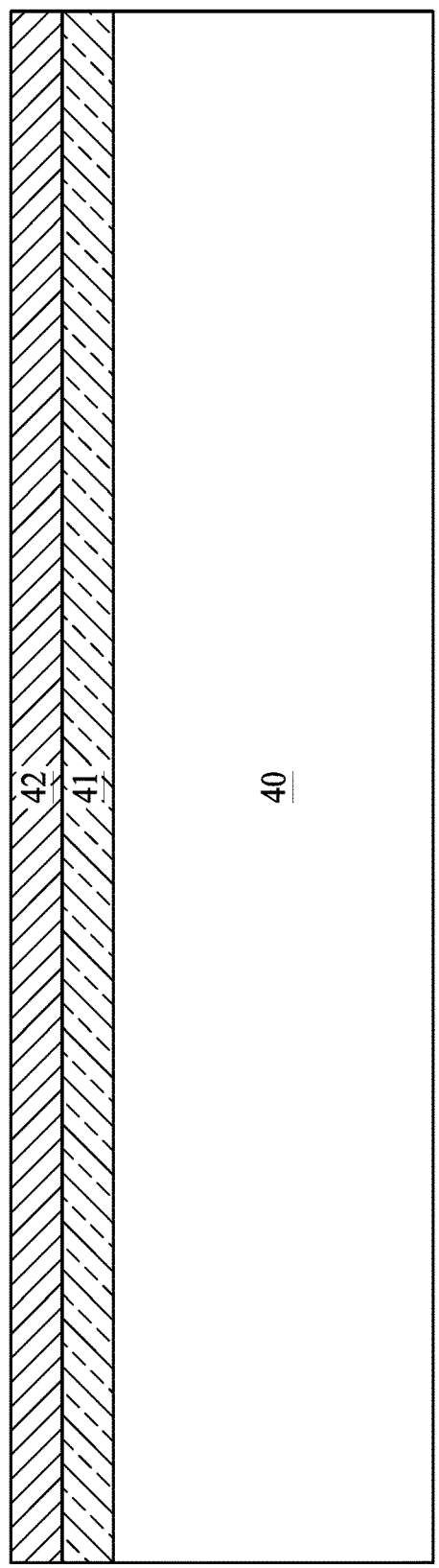
FIG. 5A illustrates a method of manufacturing a substrate according to some embodiments of the present disclosure.
Figure 5B:
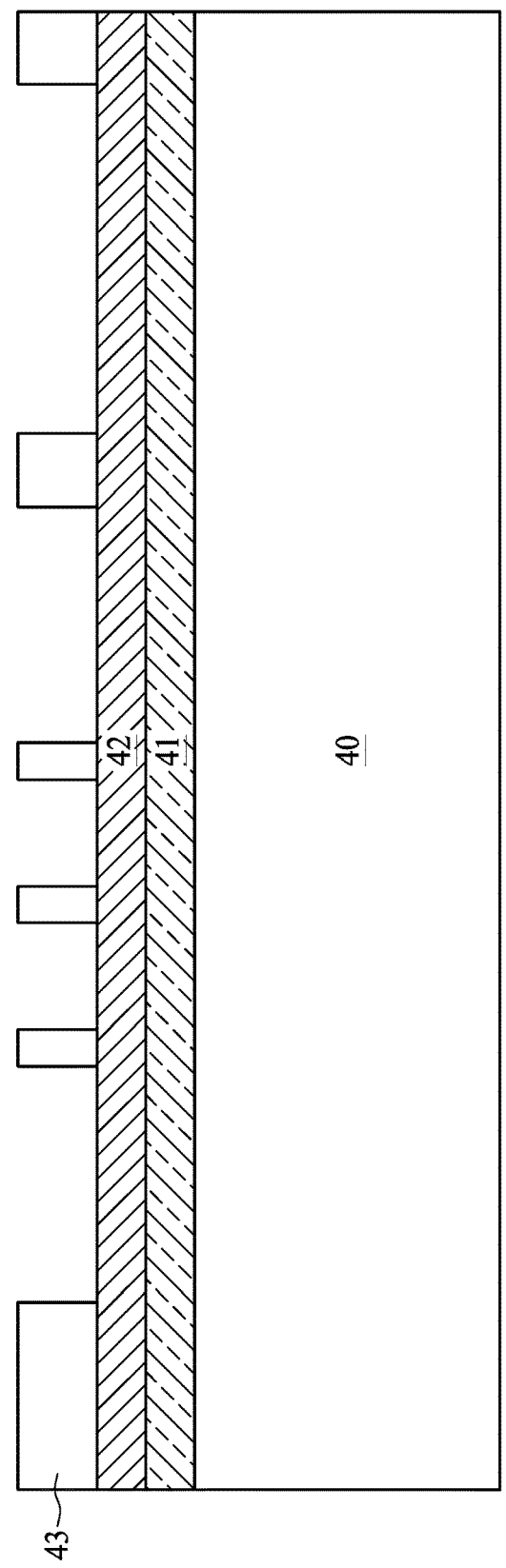
FIG. 5B illustrates a method of manufacturing a substrate according to some embodiments of the present disclosure.
Figure 5C:
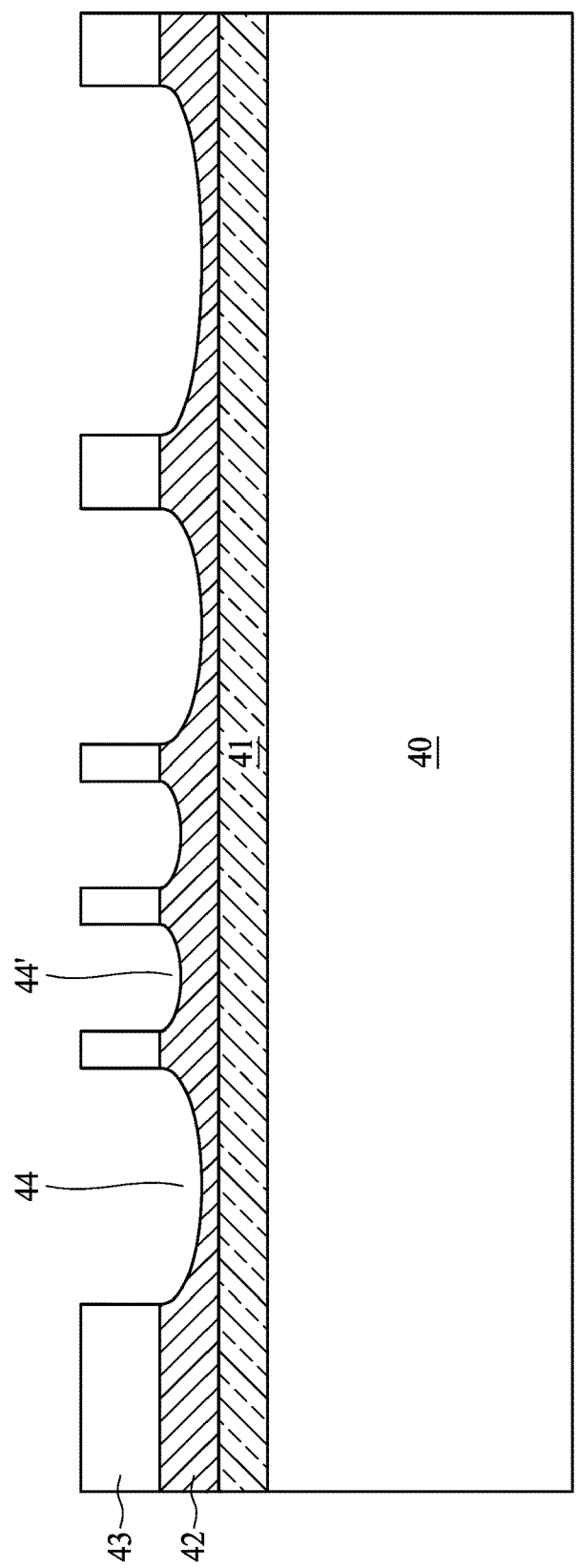
FIG. 5C illustrates a method of manufacturing a substrate according to some embodiments of the present disclosure.
Figure 5D:
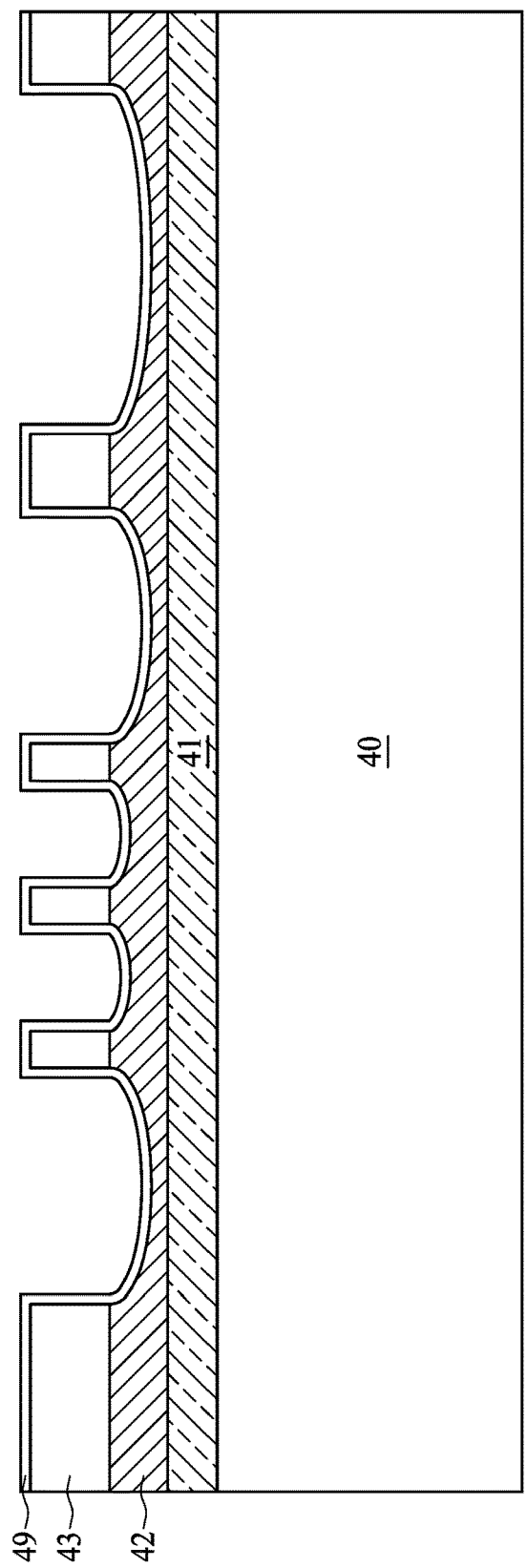
FIG. 5D illustrates a method of manufacturing a substrate according to some embodiments of the present disclosure.
Figure 5E:
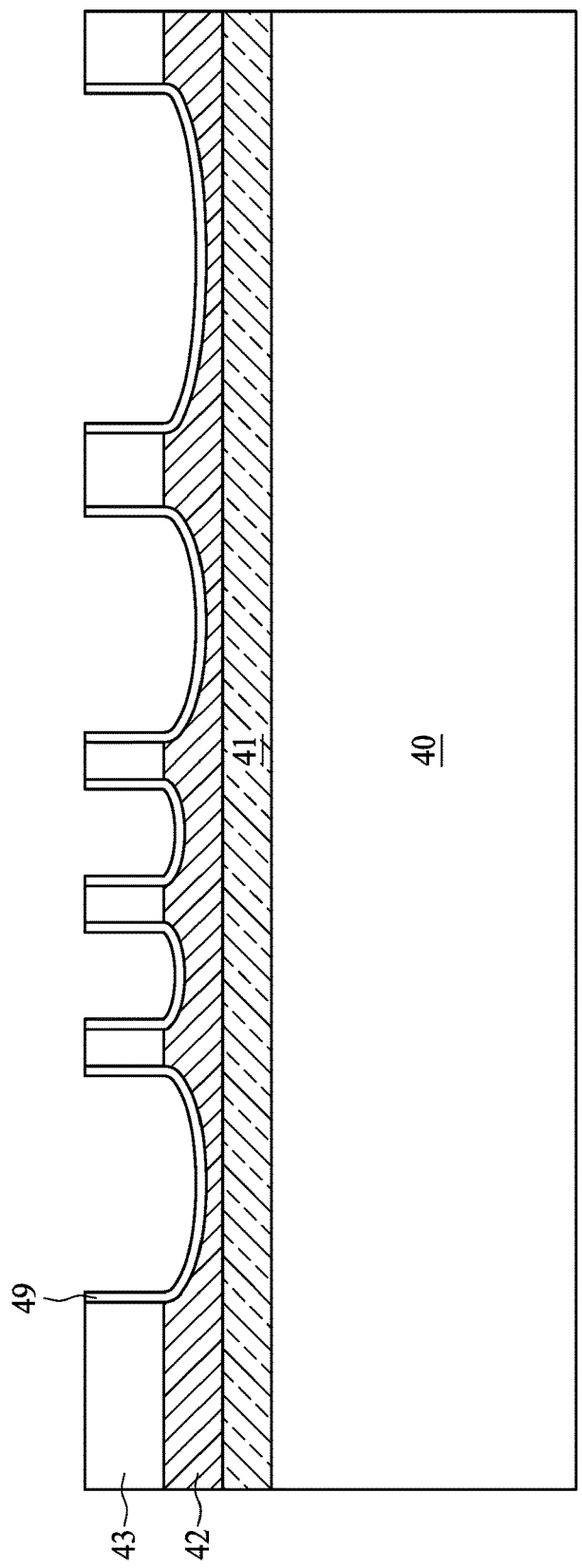
FIG. 5E illustrates a method of manufacturing a substrate according to some embodiments of the present disclosure.
Figure 5F:
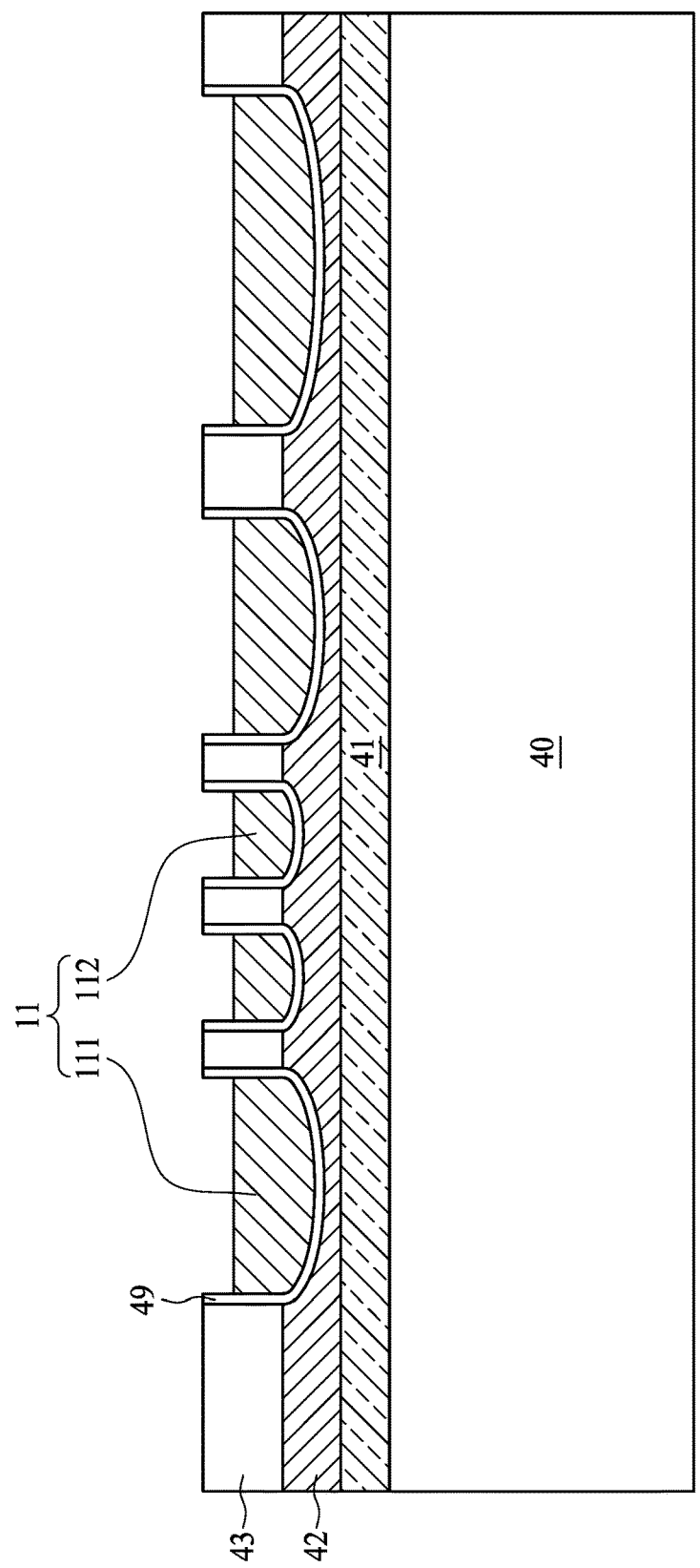
FIG. 5F illustrates a method of manufacturing a substrate according to some embodiments of the present disclosure.
Figure 5G:
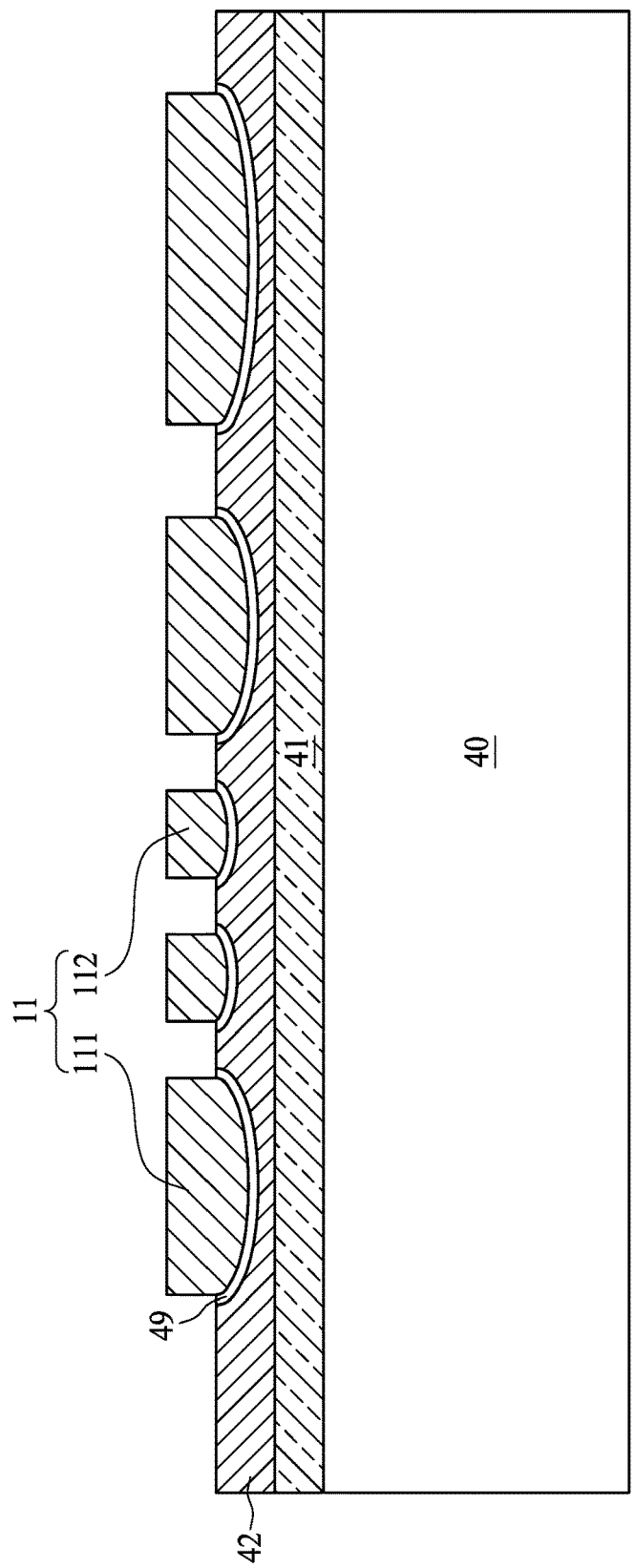
FIG. 5G illustrates a method of manufacturing a substrate according to some embodiments of the present disclosure.
Figure 5H:
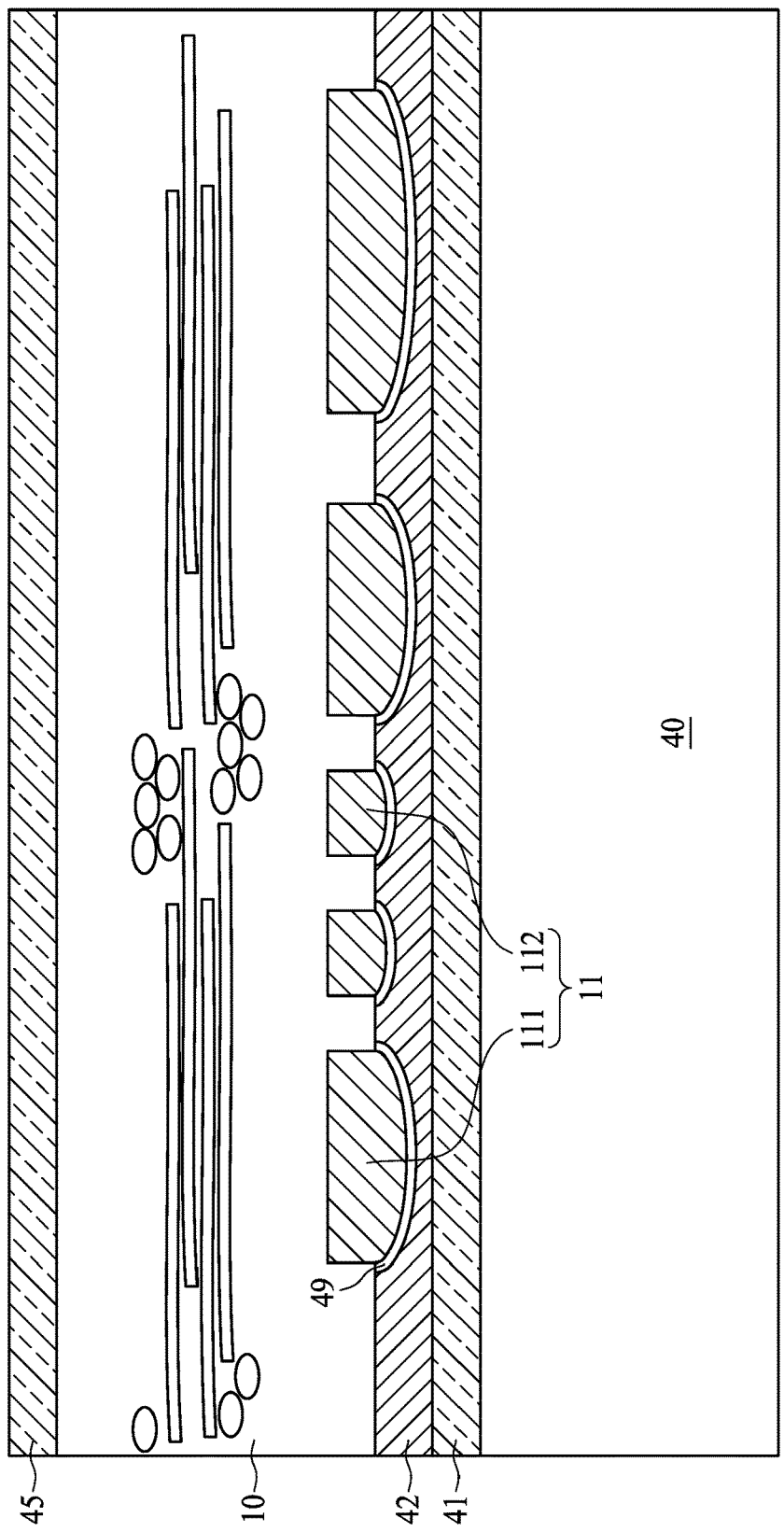
FIG. 5H illustrates a method of manufacturing a substrate according to some embodiments of the present disclosure.
Figure 5I:
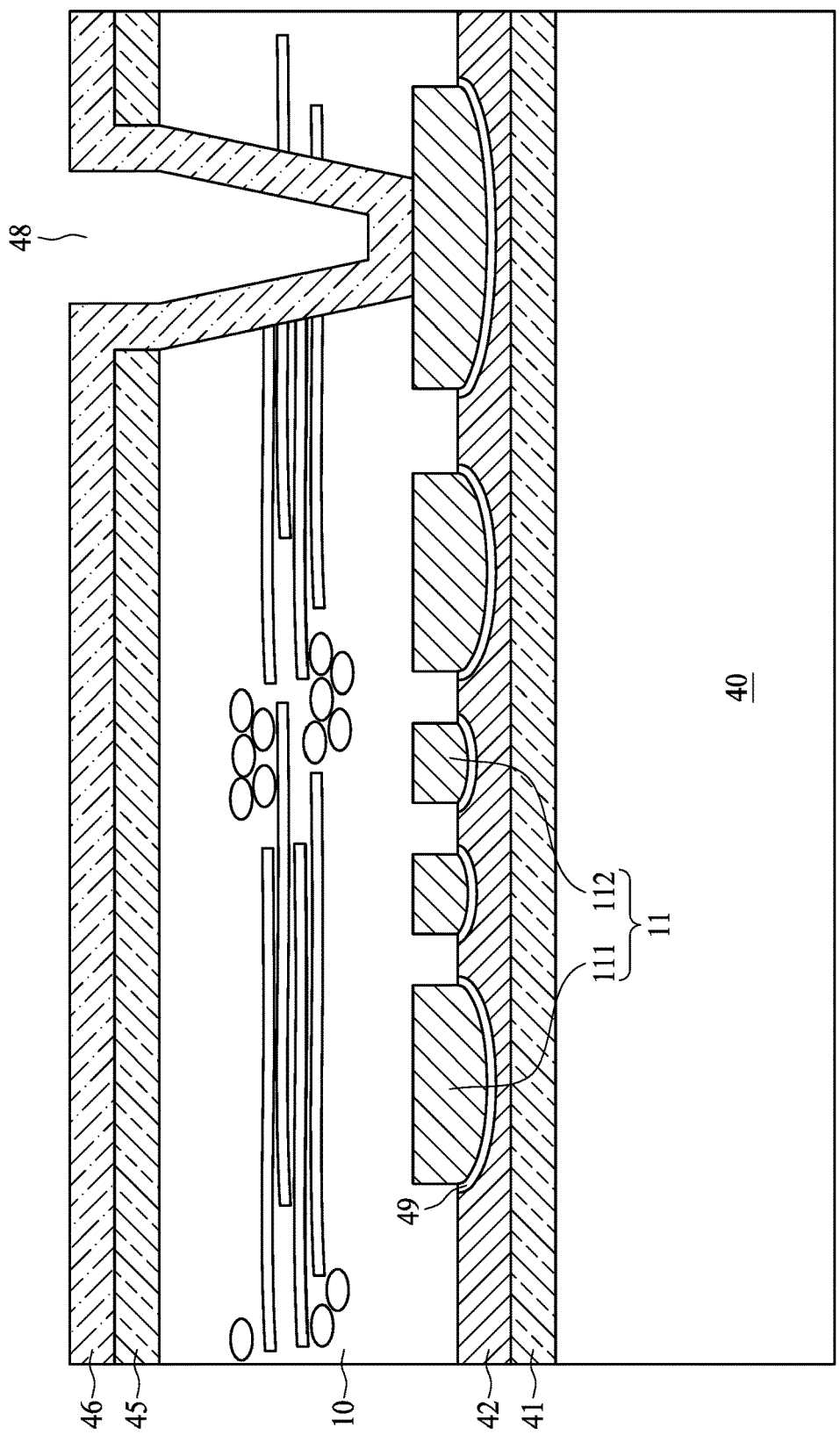
FIG. 5I illustrates a method of manufacturing a substrate according to some embodiments of the present disclosure.
Figure 5J:
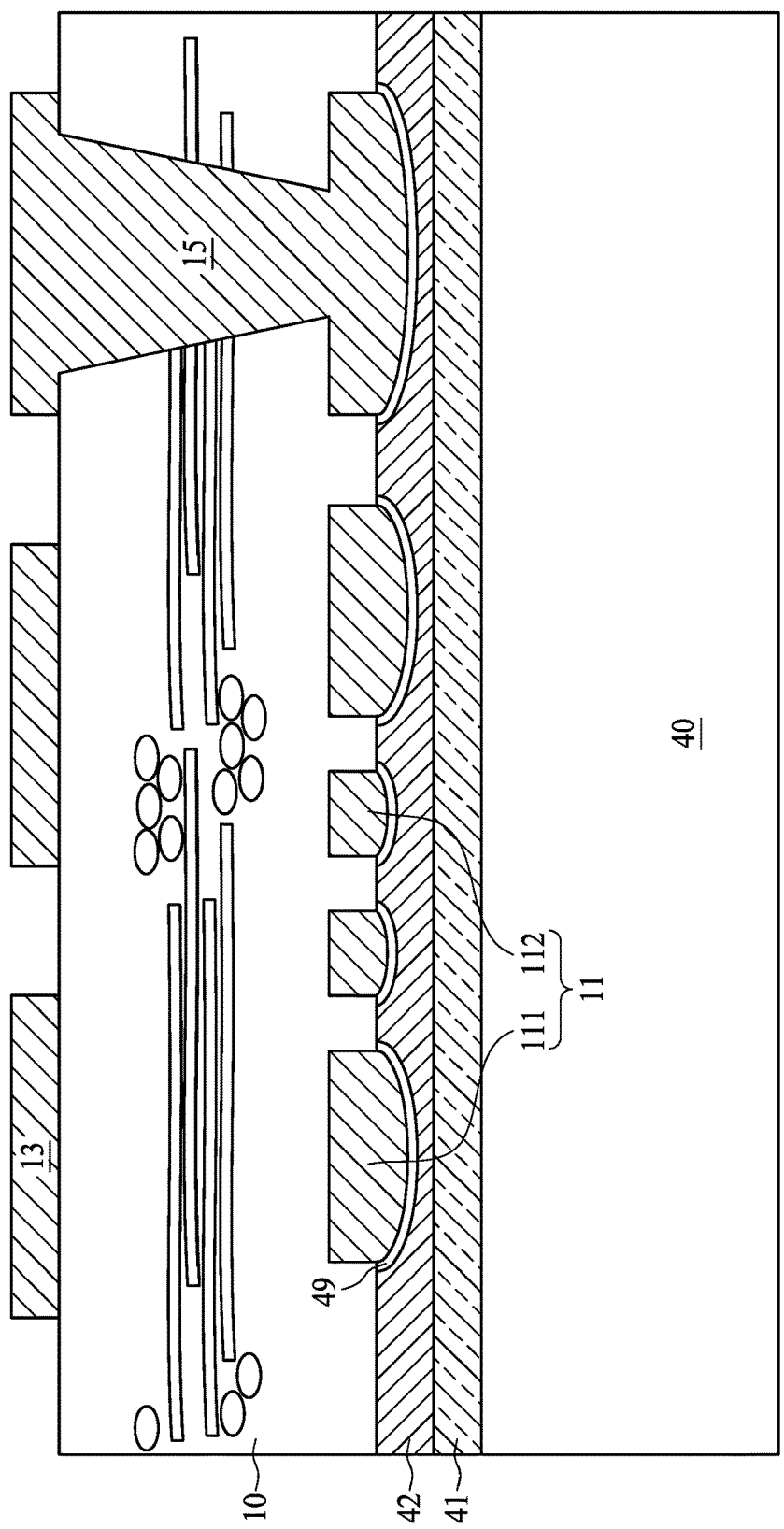
FIG. 5J illustrates a method of manufacturing a substrate according to some embodiments of the present disclosure.
Figure 5K:
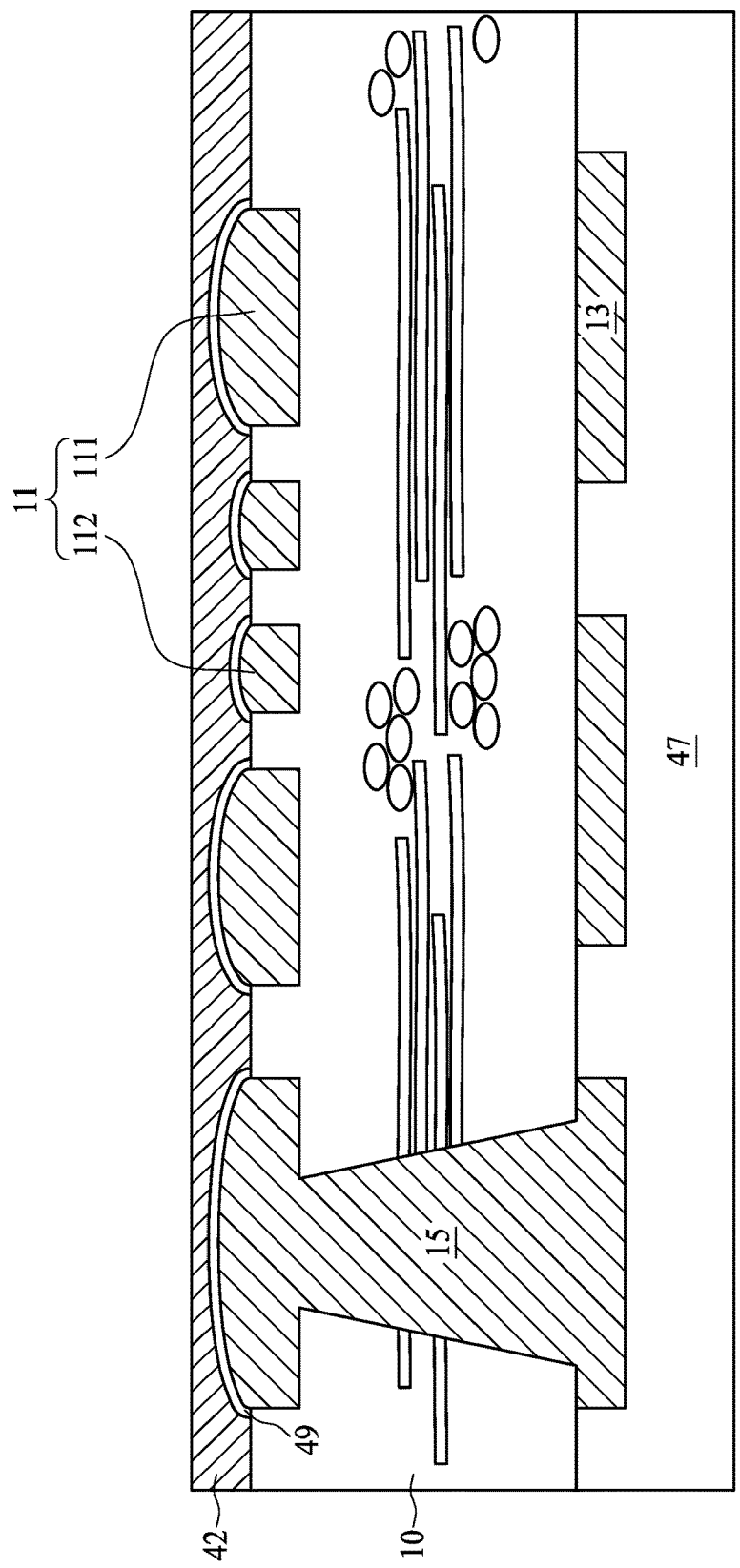
FIG. 5K illustrates a method of manufacturing a substrate according to some embodiments of the present disclosure.
Figure 5L:
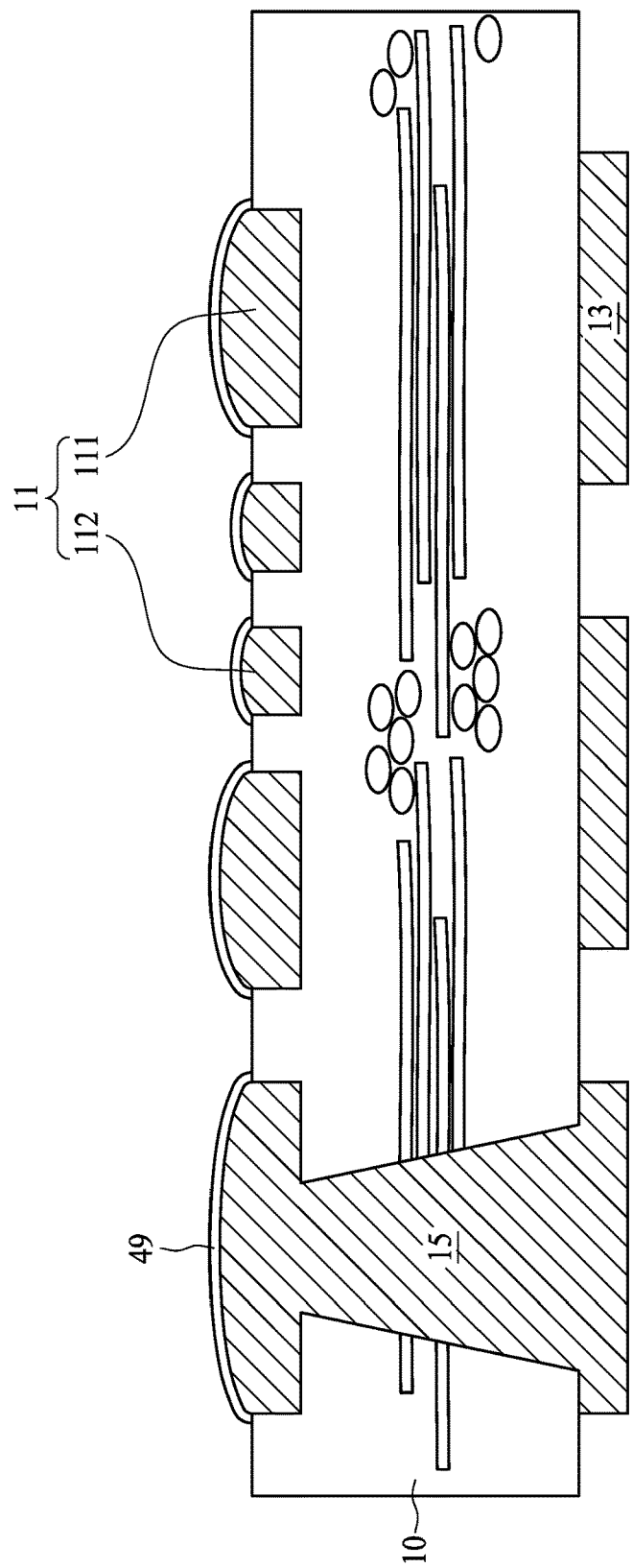
FIG. 5L illustrates a method of manufacturing a substrate according to some embodiments of the present disclosure.
Figure 5M:
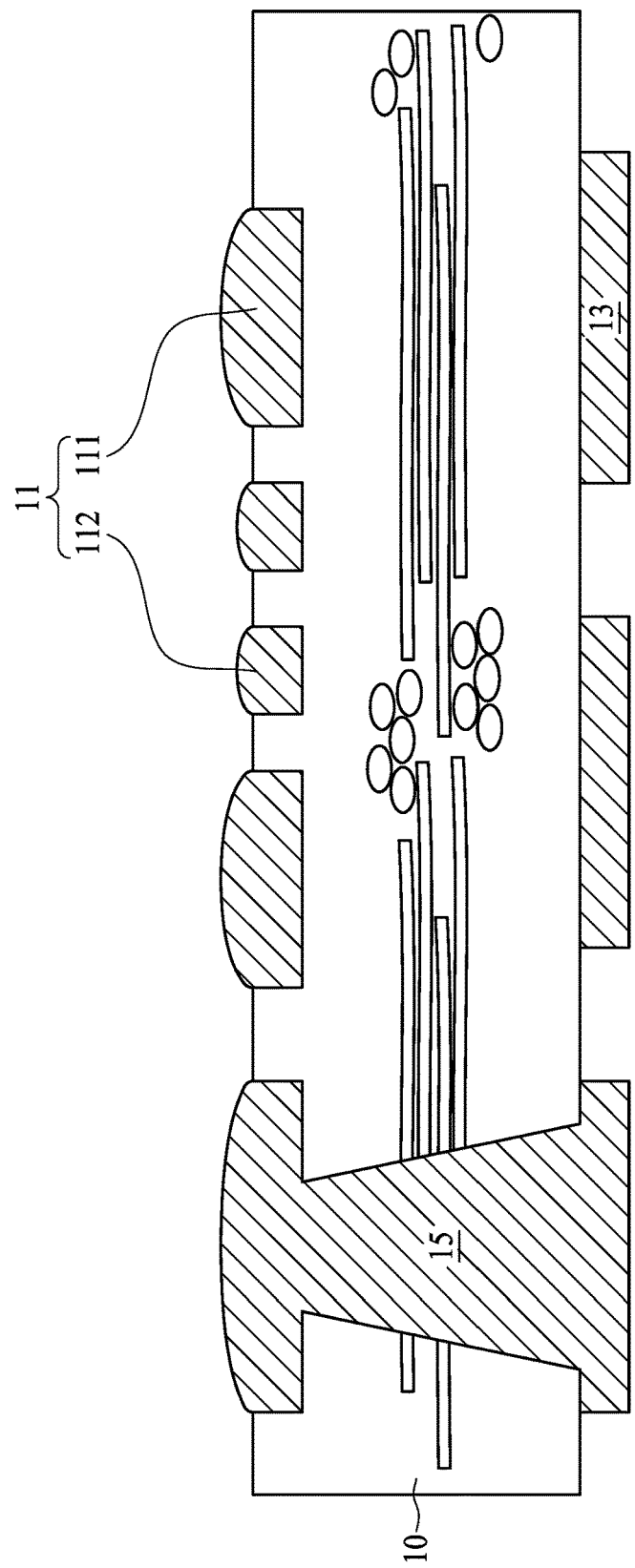
FIG. 5M illustrates a method of manufacturing a substrate according to some embodiments of the present disclosure.
Figure 5N:
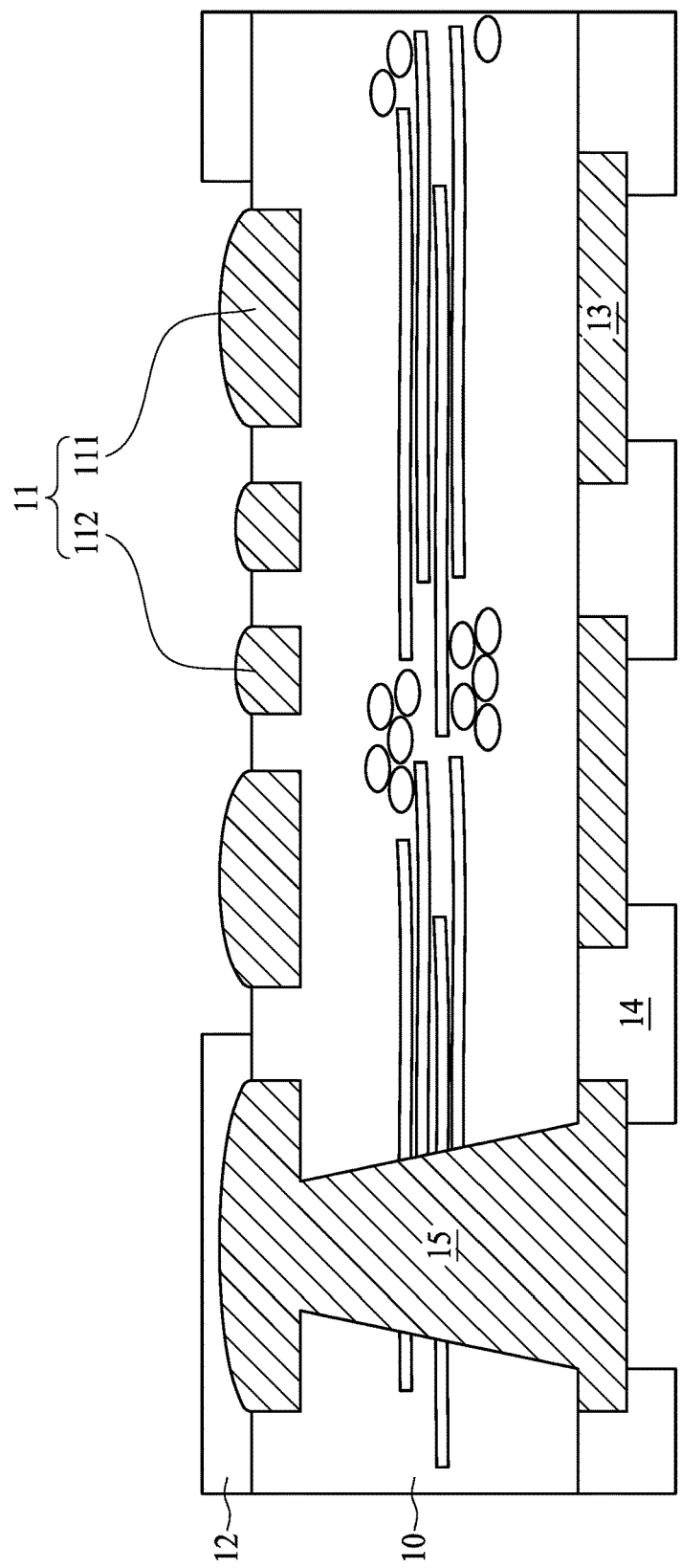
FIG. 5N illustrates a method of manufacturing a substrate according to some embodiments of the present disclosure.

FIG. 5A through FIG. 5N illustrate some embodiments of a method of manufacturing the substrate 1 according to some embodiments of the present disclosure.

Referring to FIG. 5A, a method for manufacturing the substrate 1 includes providing a carrier 40 with a conductive layer 41 and a conductive layer 42. The thickness of the conductive layer 41 is in a range from approximately 2 μm to approximately 4 μm. The thickness of the conductive layer 42 is in a range from approximately 16 μm to approximately 20 μm. In some embodiments, the conductive layer 41 and the conductive layer 42 include copper, a copper alloy, or another metal.

Referring to FIG. 5B, a patterned photoresist layer 43 is applied on the conductive layer 32.

Referring to FIG. 5C, the conductive layer 42 is etched to form a recess 44 and a recess 44'. The depth of the recess 44 is greater than the depth of the recess 44'.

Referring to FIG. 5D, a conductive layer 49 is sputtered over or in to the recess 44 and the recess 44'. In some embodiments, the conductive layer 49 includes titanium, a titanium alloy, or another metal. The conductive layer 49 may be a barrier layer.

Referring to FIG. 5E, a portion of the conductive layer 49 on the top surface of the patterned photoresist layer 43 is removed by a polishing operation.

Referring to FIG. 5F, the patterned conductive layer 11 is plated in the recess 44 and the recess 44' and over the conductive layer 49. The patterned conductive layer 11 includes the portion 111 and the portion 112. The portion 111 of the patterned conductive layer 11 is formed in the recess 44. The portion 112 of the patterned conductive layer 11 is formed in the recess 44'.

Referring to FIG. 5G, the patterned photoresist layer 43 is stripped to expose the portion 111 and the portion 112 of the patterned conductive layer 11. A portion of the conductive layer 49 on the side wall of the patterned conductive layer 11 is removed by an etching operation.

Referring to FIG. 5H, the dielectric layer 10 is laminated on the patterned conductive layer 11. The dielectric layer 10 includes a resin layer and a fiberglass. A conductive layer 45 is disposed on the dielectric layer 10.

Referring to FIG. 5I, an opening 48 is formed in the dielectric layer 10 to expose the patterned conductive layer 11. The opening 48 of the dielectric layer 10 may be formed by a laser drilling technique, a mechanical drilling technique, or an etching technique. A seed layer 46 is formed over the conductive layer 45 and the dielectric layer 10, and in the opening 48.

Referring to FIG. 5J, the patterned conductive layer 13 is formed on the dielectric layer 10. The interconnection element 15 is formed to electrically connect the patterned conductive layer 11 to the patterned conductive layer 13.

Referring to FIG. 5K, a dielectric layer 47 is laminated on the dielectric layer 10 to cover (e.g. completely cover) the patterned conductive layer 13. The dielectric layer 47 may be a photoresist dry film. The carrier 40 and the conductive layer 41 are removed.

Referring to FIG. 5L, the conductive layer 42 is etched to expose the conductive layer 49. Then, the dielectric layer 47 is stripped to expose the patterned conductive layer 13.

Referring to FIG. 5M, the conductive layer 49 is etched to expose the patterned conductive layer 11. In some embodiments, the process of etching the conductive layer 49 may be omitted, or may be performed such that at least a portion of the conductive layer 49 remains on the patterned conductive layer 11.

Referring to FIG. 5N, the dielectric layer 12 is formed on the dielectric layer 10 to partially cover the patterned conductive layer 11. The dielectric layer 14 is formed on the dielectric layer 10 to partially cover the patterned conductive layer 13. The dielectric layer 12 and the dielectric layer 14 may be a solder mask layer.

FIG. 6A through FIG. 6G illustrate some embodiments of a method of manufacturing the substrate 2 according to some embodiments of the present disclosure.

Figure 6A:
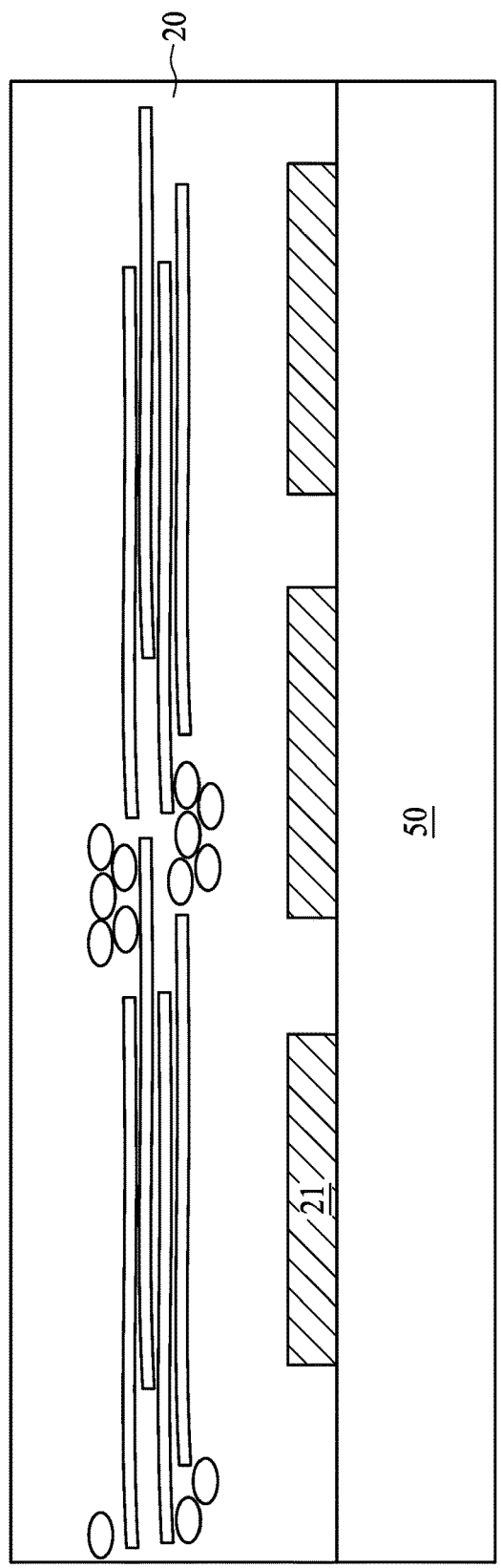
FIG. 6A illustrates a method of manufacturing a substrate according to some embodiments of the present disclosure.

Referring to FIG. 6A, a method for manufacturing the substrate 2 includes providing a core layer 50 with a patterned conductive layer 21. The dielectric layer 20 is laminated on the core layer 50. The dielectric layer 20 includes a resin layer and a fiberglass.

Figure 6B:
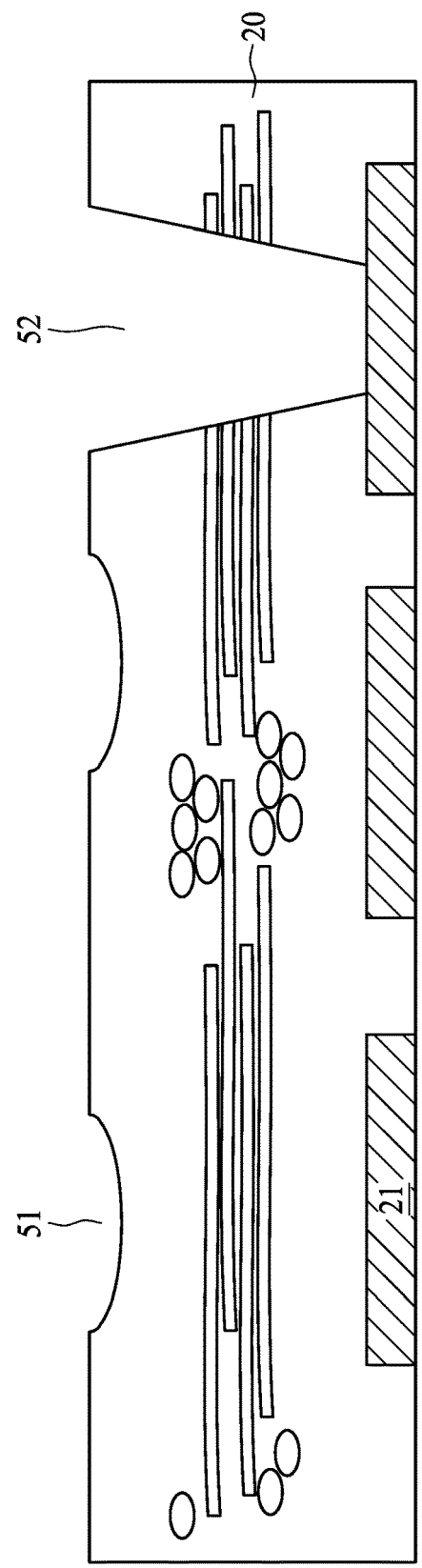
FIG. 6B illustrates a method of manufacturing a substrate according to some embodiments of the present disclosure.

Referring to FIG. 6B, a recess 51 is formed by a laser ablation operation or a plasma ablation operation. An opening 52 is formed in the dielectric layer 20 to expose the patterned conductive layer 21. The opening 52 of the dielectric layer 20 may be formed by a laser drilling technique, a mechanical drilling technique, or an etching technique. The opening 52 may be deeper than the recess 51.

Figure 6C:
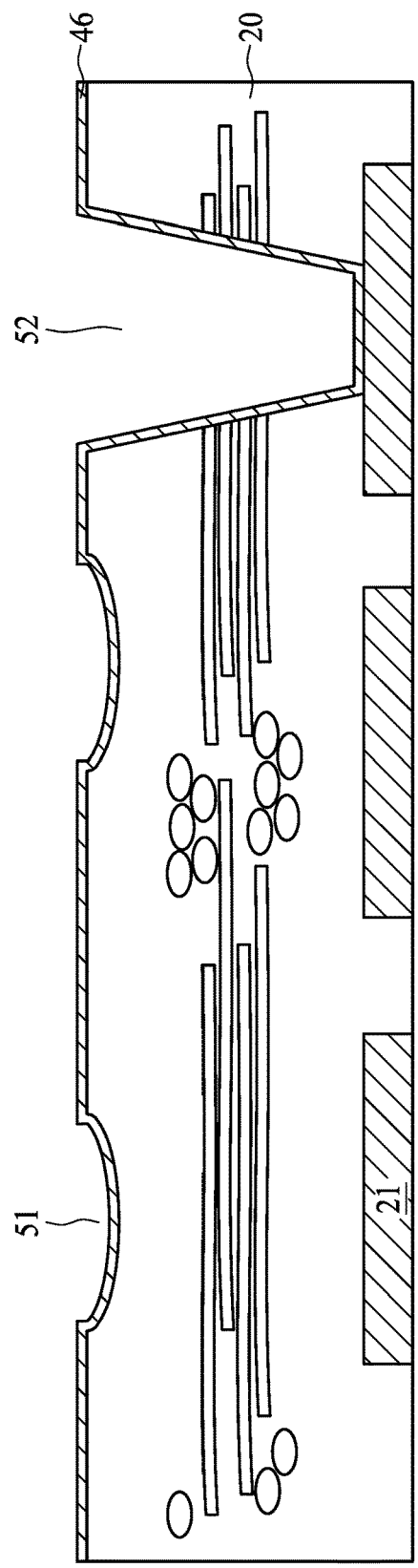
FIG. 6C illustrates a method of manufacturing a substrate according to some embodiments of the present disclosure.

Referring to FIG. 6C, a seed layer 46 is formed on the dielectric layer 20 and in the recess 51 and the opening 52.

Figure 6D:
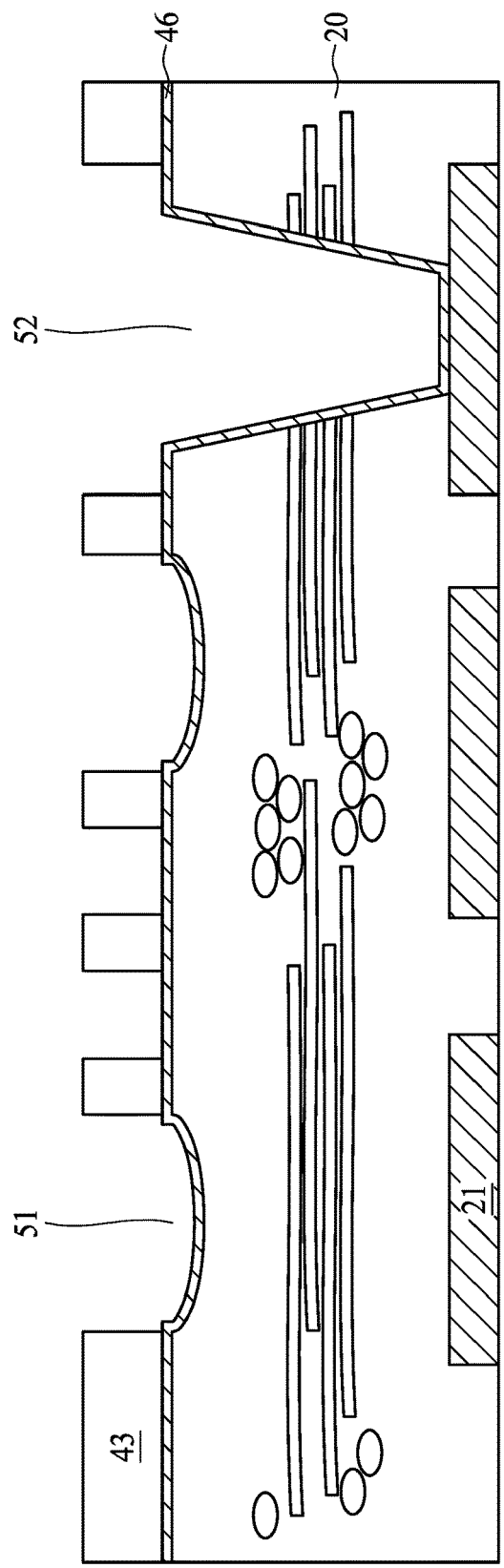
FIG. 6D illustrates a method of manufacturing a substrate according to some embodiments of the present disclosure.

Referring to FIG. 6D, a patterned photoresist layer 43 is applied on the seed layer 46.

Figure 6E:
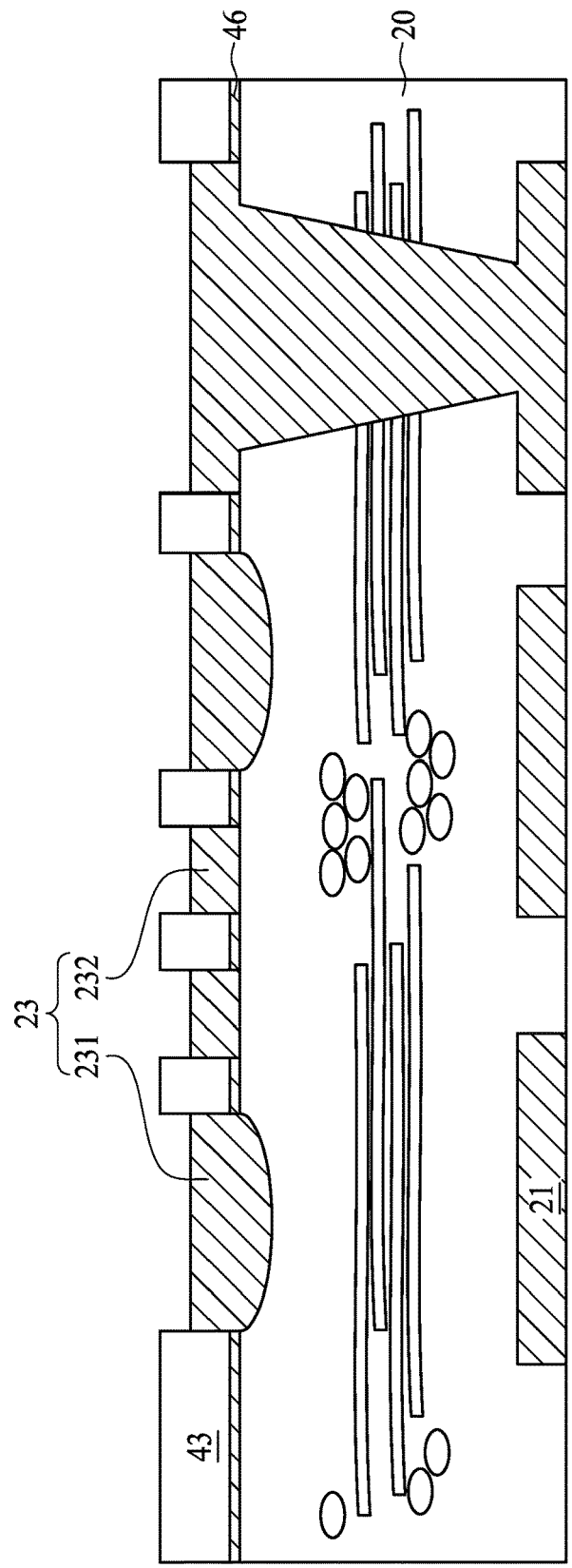
FIG. 6E illustrates a method of manufacturing a substrate according to some embodiments of the present disclosure.

Referring to FIG. 6E, the patterned conductive layer 23 is formed in the recess 51 and the opening 52. The patterned conductive layer 23 includes the portion 231 and the portion 232. The portion 231 of the patterned conductive layer 23 is formed in the recess 51. The portion 232 of the patterned conductive layer 23 is formed in a space defined by adjacent two portions of the patterned photoresist layer 43.

Figure 6F:
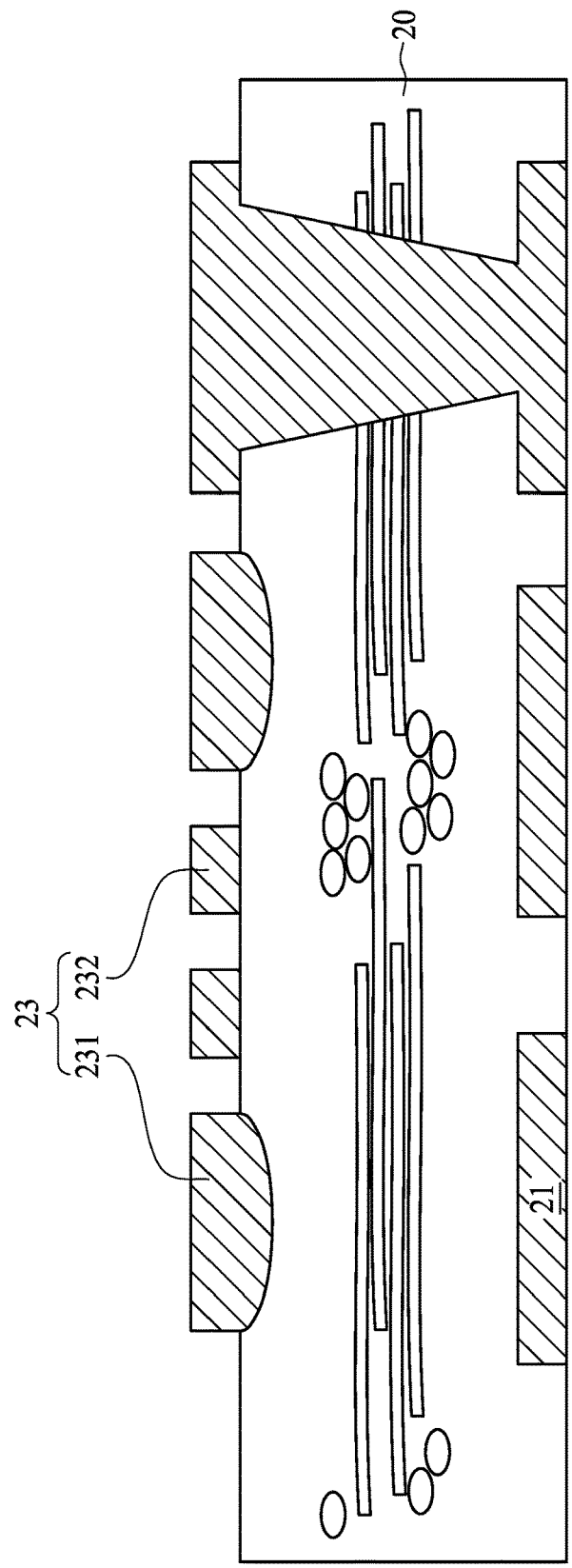
FIG. 6F illustrates a method of manufacturing a substrate according to some embodiments of the present disclosure.

Referring to FIG. 6F, the patterned photoresist layer 43 is stripped and the seed layer 46 under the patterned photoresist layer 43 is etched to expose the portion 231 and the portion 232 of the patterned conductive layer 23.

Figure 6G:
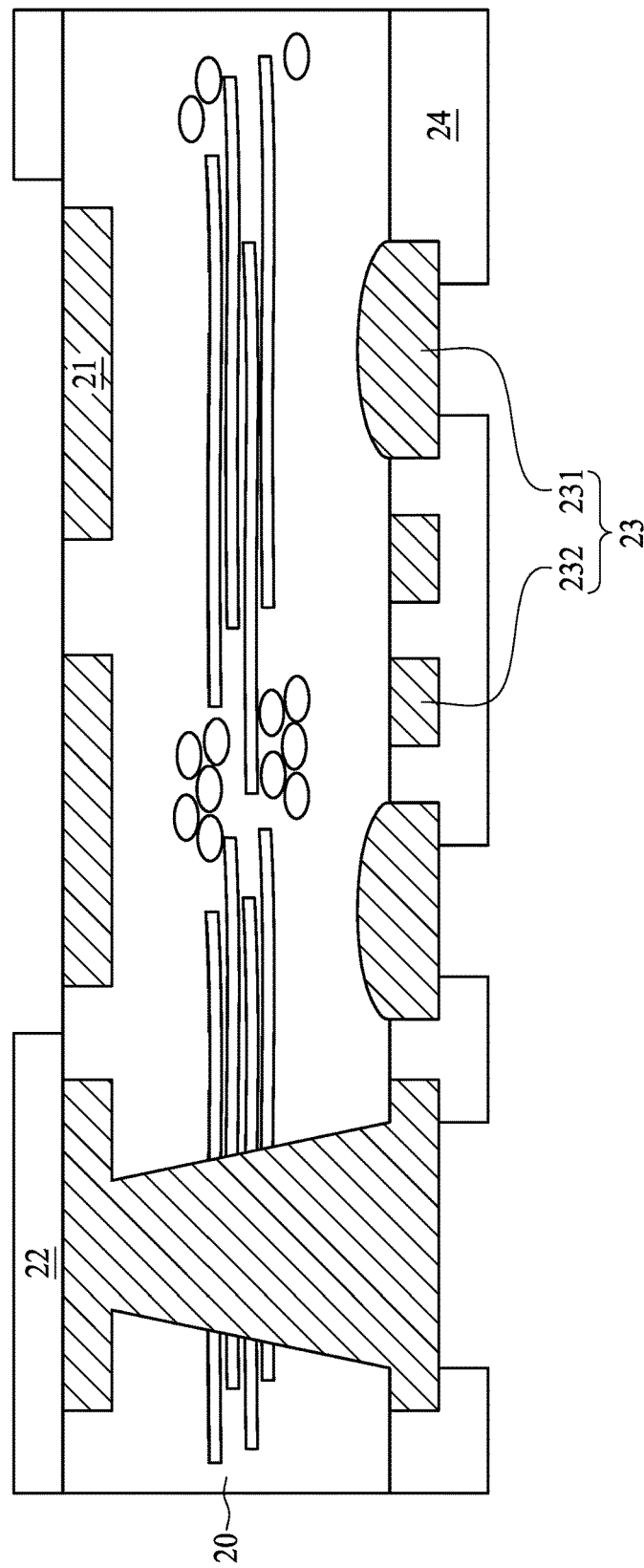
FIG. 6G illustrates a method of manufacturing a substrate according to some embodiments of the present disclosure.

Referring to FIG. 6G, the dielectric layer 22 is formed on the dielectric layer 20 to partially cover the patterned conductive layer 21. The dielectric layer 24 is formed on the dielectric layer 20 to partially cover the patterned conductive layer 23. The dielectric layer 22 and the dielectric layer 24 may be a solder mask layer.

Figure 7:
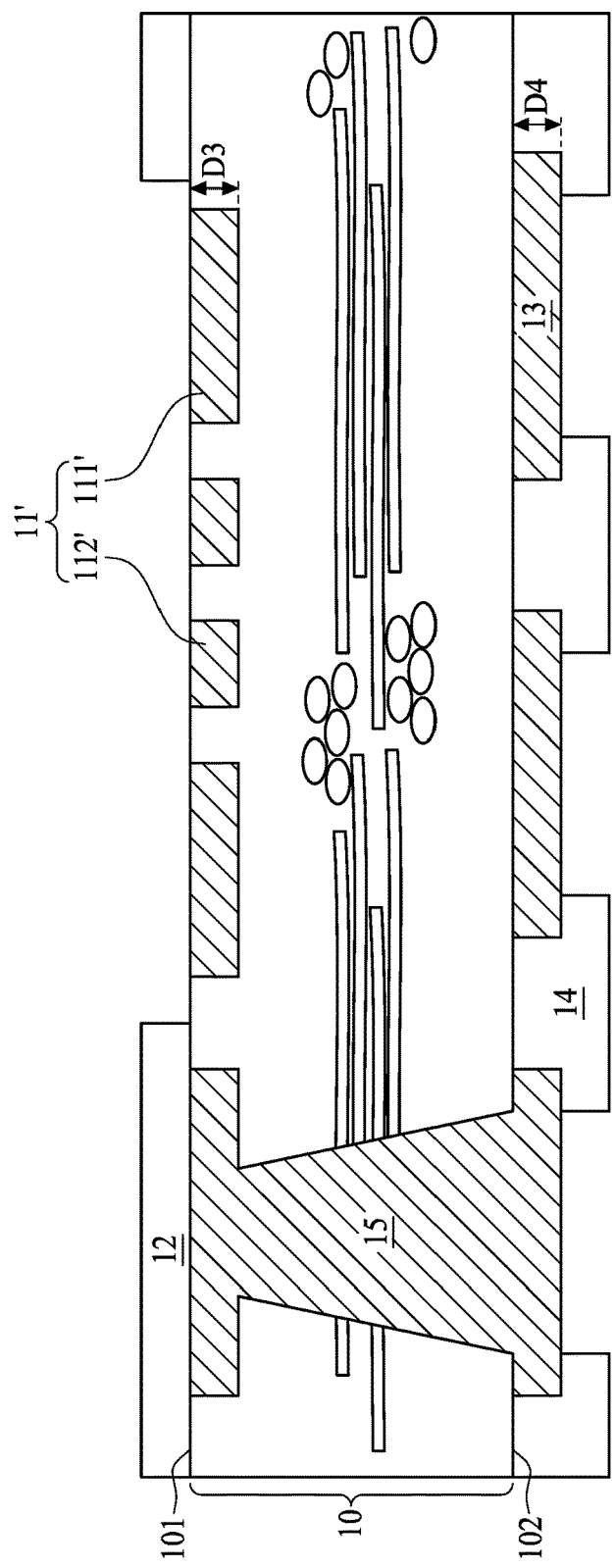
FIG. 7 illustrates a cross-sectional view of a comparative substrate.

FIG. 7 illustrates a cross-sectional view of a comparative substrate 4. The substrate 4 includes a dielectric layer 10, a patterned conductive layer 11', a dielectric layer 12, a patterned conductive layer 13, a dielectric layer 14, and an interconnection element 15.

The dielectric layer 10 has a surface 101 and a surface 102 opposite to the surface 101. The dielectric layer 10 includes a resin layer and a fiberglass.

The patterned conductive layer 11' is adjacent to the surface 101 of the dielectric layer 10. The patterned conductive layer 11' includes a portion 111' and a portion 112'. Each of the portion 111' and the portion 112' of the patterned conductive layer 11' are embedded (e.g. completely embedded) in the dielectric layer 10. The patterned conductive layer 11' has a thickness D3. A thickness of the portion 111' of the patterned conductive layer 11' is substantially the same as a thickness of the portion 112' of the patterned conductive layer 11'.

The patterned conductive layer 13 is adjacent to the surface 102 of the dielectric layer 10. The patterned conductive layer 13 is on the surface 102 of the dielectric layer 10. The patterned conductive layer 13 has a thickness D4. The patterned conductive layer 11 is electrically connected to the patterned conductive layer 13 via the interconnection element 15. In some embodiments, the patterned conductive layer 11, the patterned conductive layer 13, and the interconnection element 15 may include copper, a copper alloy, another metal, or other suitable materials.

The dielectric layer 12 is disposed on the surface 101 of the dielectric layer 10. The dielectric layer 12 partially covers the patterned conductive layer 11. The dielectric layer 14 is disposed on the surface 102 of the dielectric layer 10. The dielectric layer 14 partially covers the patterned conductive layer 13.

The thickness D4 of the patterned conductive layer 13 is greater than the thickness D3 of the patterned conductive layer 11 due to some etching operations and the operations for forming the interconnection element 15. Accordingly, a thickness of the dielectric layer 14 is greater than a thickness of the dielectric layer 12.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a surface can be deemed to be planar or substantially planar if a difference between a highest point and a lowest point of the surface is no greater than 5 µm, no greater than 2 µm, no greater than 1 µm, or no greater than 0.5 µm.

The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for packaging a semiconductor device, comprising:
   a first dielectric layer having a first surface and a second surface opposite to the first surface;
   a first patterned conductive layer adjacent to the first surface of the first dielectric layer, the first patterned conductive layer comprising a first portion and a second portion, each of the first portion and the second portion being embedded in the first dielectric layer and protruding relative to the first surface of the first dielectric layer toward a direction away from the second surface of the first dielectric layer; and
   a second patterned conductive layer adjacent to the second surface of the first dielectric layer and electrically connected to the first patterned conductive layer,
   wherein a thickness of the first portion of the first patterned conductive layer is greater than a thickness of the second portion of the first patterned conductive layer.

2. The substrate of claim 1, wherein the first portion of the first patterned conductive layer protrudes a first distance relative to the first surface of the first dielectric layer, and the second portion of the first patterned conductive layer protrudes a second distance relative to the first surface of the first dielectric layer, and wherein the first distance is greater than the second distance.

3. The substrate of claim 2, wherein a surface of the first portion of the first patterned conductive layer has a curved shape and a surface of the second portion of the first patterned conductive layer has a curved shape.

4. The substrate of claim 1, wherein the first patterned conductive layer is an integrated layer.

5. The substrate of claim 1, further comprising a third conductive layer covering a surface of the first portion of the first patterned conductive layer and a surface of the second portion of the first patterned conductive layer.

6. The substrate of claim 1, wherein the first patterned conductive layer comprises a plurality of first portions including the first portion, and comprises a plurality of second portions including the second portion, at least one of the second portions of the first patterned conductive layer is disposed between two adjacent ones of the first portion of the first patterned conductive layer.

7. The substrate of claim 1, wherein the second portion of the first patterned conductive layer is adjacent to the first portion of the first patterned conductive layer, and a pitch between the second portion and the first portion of the first patterned conductive layer is less than or equal to about 7 micrometers ($\mu m$).

8. The substrate of claim 1, wherein a dimension of the second portion or a pitch between the adjacent second portions of the first patterned conductive layer is less than or equal to about 7 $\mu m$.

9. The substrate of claim 1, further comprising a second dielectric layer disposed on the first surface of the first dielectric layer, the second dielectric layer at least partially covering the first patterned conductive layer.

10. The substrate of claim 1, wherein the first portion of the first patterned conductive layer is a pad and the second portion of the first patterned conductive layer is a trace.

11. The substrate of claim 1, wherein the second patterned conductive layer comprises a first portion and a second portion, and the first portion of the second patterned conductive layer has a curved surface adjacent to the second surface of the first dielectric layer.

12. The substrate of claim 11, wherein the first portion of the second patterned conductive layer is embedded in the second surface of the first dielectric layer and protrudes relative to the second surface of the first dielectric layer toward a direction away from the first surface of the first dielectric layer.

13. The substrate of claim 11, wherein a thickness of the first portion of the second patterned conductive layer is greater than a thickness of the second portion of the second patterned conductive layer.

14. The substrate of claim 11, further comprising a second dielectric layer and a third dielectric layer, the second dielectric layer disposed on the first surface of the first dielectric layer and partially covering the first patterned conductive layer, and the third dielectric layer disposed on the second surface of the first dielectric layer and partially covering the second patterned conductive layer.

15. The substrate of claim 14, wherein the second dielectric layer and the third dielectric layer are solder mask layers.

16. The substrate of claim 11, wherein the second patterned conductive layer comprises a plurality of first portions including the first portion, and comprises a plurality of second portions including the second portion, and at least one of the second portions of the second patterned conductive layer is disposed between two adjacent ones of the first portions of the second patterned conductive layer.

17. The substrate of claim 11, wherein the first portion of the second patterned conductive layer is a pad and the second portion of the second patterned conductive layer is a trace.

18. The substrate of claim 11, wherein the second portion of the second patterned conductive layer has a substantially planar surface adjacent to the second surface of the first dielectric layer.

19. The substrate of claim 1, further comprising an interconnection element connected between the first patterned conductive layer and the second patterned conductive layer.

20. The substrate of claim 19, wherein the interconnection element and the second patterned conductive layer are integrally formed.

* * * * *